United States Patent
Song

(10) Patent No.: US 11,249,843 B2
(45) Date of Patent: Feb. 15, 2022

(54) SEMICONDUCTOR DEVICES AND SEMICONDUCTOR SYSTEMS INCLUDING THE SAME

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/909,184

(22) Filed: Jun. 23, 2020

(65) Prior Publication Data

US 2021/0141687 A1 May 13, 2021

Related U.S. Application Data

(63) Continuation-in-part of application No. 16/846,042, filed on Apr. 10, 2020, now Pat. No. 11,164,651.

(30) Foreign Application Priority Data

Nov. 7, 2019 (KR) .................. 10-2019-0142088
Dec. 4, 2019 (KR) .................. 10-2019-0160237

(51) Int. Cl.
*G11C 16/04* (2006.01)
*G06F 11/10* (2006.01)
*G06F 3/06* (2006.01)

(52) U.S. Cl.
CPC .......... *G06F 11/106* (2013.01); *G06F 3/0638* (2013.01); *G06F 3/0659* (2013.01)

(58) Field of Classification Search
CPC ..... G06F 11/106; G06F 3/0638; G06F 3/0659
See application file for complete search history.

(56) References Cited

U.S. PATENT DOCUMENTS

| | | | |
|---|---|---|---|
| 6,560,725 B1 * | 5/2003 | Longwell ............. | G06F 11/073 711/105 |
| 7,143,329 B1 | 11/2006 | Trimberger et al. | |
| 8,588,017 B2 | 11/2013 | Park et al. | |
| 10,613,928 B2 * | 4/2020 | Kim ..................... | G06F 11/106 |
| 10,817,371 B2 * | 10/2020 | Rooney ................ | G11C 29/44 |
| 10,922,170 B2 | 2/2021 | Kim et al. | |
| 2002/0051397 A1 | 5/2002 | Watanabe et al. | |
| 2004/0243886 A1 | 12/2004 | Klein | |

(Continued)

FOREIGN PATENT DOCUMENTS

| KR | 100667784 B1 | 1/2007 |
|---|---|---|
| KR | 1020170056823 A | 5/2017 |
| KR | 1020190063123 A | 6/2019 |

*Primary Examiner* — Pho M Luu
(74) *Attorney, Agent, or Firm* — William Park & Associates Ltd.

(57) ABSTRACT

A semiconductor device includes an error check and scrub (ECS) command generation circuit and a period signal generation circuit. The ECS command generation circuit generates an ECS command based on a refresh command. The period signal generation circuit generates a sampling period signal, during a sampling period, based on the ECS command and generates an operation period signal, during an operation period, based on the ECS command. A latch error flag is generated to include information on whether errors exist in codewords during the sampling period, and an ECS operation is performed based on the latch error flag, during the operation period, for memory cells that store an erroneous codeword among the codewords.

20 Claims, 28 Drawing Sheets

(56) References Cited

U.S. PATENT DOCUMENTS

| | | |
|---|---|---|
| 2006/0117155 A1 | 6/2006 | Ware et al. |
| 2007/0038919 A1 | 2/2007 | Sekiguchi et al. |
| 2016/0026533 A1 | 1/2016 | Ishikawa |
| 2017/0060681 A1 | 3/2017 | Halbert et al. |
| 2018/0150350 A1* | 5/2018 | Cha .................... G06F 11/1016 |
| 2019/0179560 A1 | 6/2019 | Moon et al. |

* cited by examiner

FIG.7

| Data Rate (Mbps) | tCCD (nck) | tDLLK (nck) |
|---|---|---|
| 2000 ~ 3200 | 8 | 1024 |
| 3201 ~ 3600 | 9 | 1024 |
| 3601 ~ 4000 | 10 | 1280 |
| 4001 ~ 4400 | 11 | 1280 |
| 4401 ~ 4800 | 12 | 1536 |
| 4801 ~ 3280 | 13 | 1536 |

SEMICONDUCTOR DEVICES AND SEMICONDUCTOR SYSTEMS INCLUDING THE SAME

CROSS-REFERENCE TO RELATED APPLICATIONS

This application is a continuation-in-part of U.S. patent application Ser. No. 16/846,042, filed on Apr. 10, 2020, which claims the priority of Korean Patent Application No. 10-2019-0142088, filed on Nov. 7, 2019 in the Korean Intellectual Property Office, and the present application claims priority under 35 U.S.C 119(a) to Korean Application No. 10-2019-0160237, filed on Dec. 4, 2019, which is incorporated herein by reference in its entirety.

BACKGROUND

1. Technical Field

Embodiments of the present disclosure relate to semiconductor devices and semiconductor systems including the same, and more particularly, to semiconductor devices correcting errors of memory cells and semiconductor systems including the same.

2. Related Art

Recently, a DDR2 scheme or a DDR3 scheme receiving and outputting four-bit data or eight-bit data during each clock cycle time has been used to improve an operation speed of semiconductor devices. If a data transmission speed of the semiconductor devices becomes faster, probability of occurring errors may increase while the data are transmitted in the semiconductor devices. Accordingly, advanced design schemes have been proposed to guarantee the reliability of the data transmission.

Whenever the data are transmitted in semiconductor devices, an error check code which is capable of detecting occurrence of errors may be generated and transmitted with the data to guarantee the reliability of data transmission. The error check code may include an error detection code (EDC) which is capable of detecting errors and an error correction code (ECC) which is capable of correcting the errors by itself.

SUMMARY

According to an embodiment, a semiconductor device includes an error check and scrub (ECS) command generation circuit and a period signal generation circuit. The ECS command generation circuit is configured to generate an ECS command based on a refresh command. The period signal generation circuit is configured to generate a sampling period signal, during a sampling period, based on the ECS command and configured to generate an operation period signal, during an operation period, based on the ECS command. A latch error flag is generated to include information on whether errors exist in codewords during the sampling period. An ECS operation is performed based on the latch error flag, during the operation period, for memory cells that store an erroneous codeword among the codewords.

According to another embodiment, a semiconductor device includes a period signal generation circuit and an error check and scrub (ECS) control circuit. The period signal generation circuit is configured to generate a sampling period signal and an operation period signal based on an ECS command that is generated according to a refresh command. The ECS control circuit is configured to operate so that a latch error flag, including information on whether errors exist in codewords, is generated based on the sampling period signal and configured to operate so that an ECS operation for memory cells, storing an erroneous codeword among the codewords, is performed based on the latch error flag and the operation period signal.

BRIEF DESCRIPTION OF THE DRAWINGS

FIG. 7 is a table, illustrating speed flags, used in the ECS control circuit of FIG. 6.

DETAILED DESCRIPTION OF THE EMBODIMENTS

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
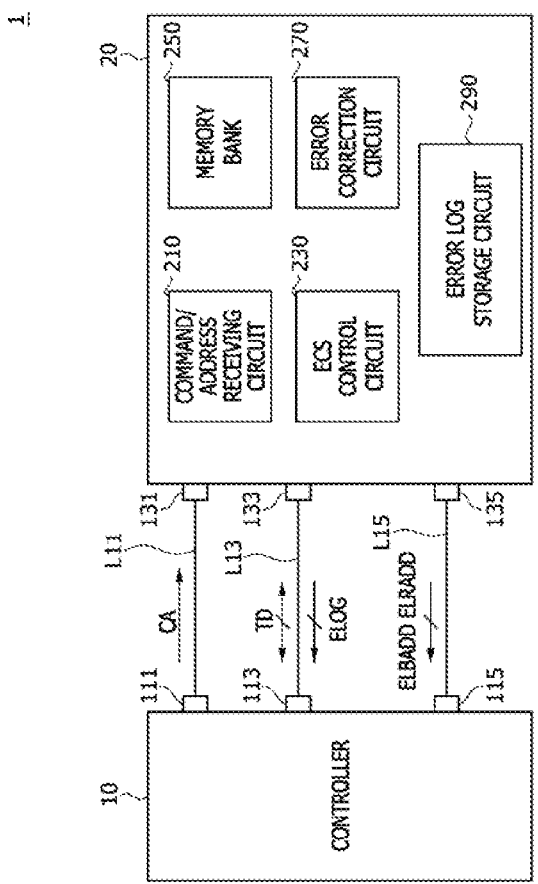
FIG. 1 is a block diagram, illustrating a configuration of a semiconductor system, according to an embodiment of the present disclosure.

As illustrated in FIG. 1, a semiconductor system 1 according to an embodiment may include a controller 10 and a semiconductor device 20. The semiconductor device 20 may include a command/address receiving circuit 210, an error check and scrub (ECS) control circuit 230, a memory bank 250, an error correction circuit 270, and an error log storage circuit 290.

The controller 10 may include a first control pin 111, a second control pin 113, and a third control pin 115. The semiconductor device 20 may include a first semiconductor pin 131, a second semiconductor pin 133, and a third semiconductor pin 135. The first control pin 111 may be connected to the first semiconductor pin 131 through a first transmission line L11. The second control pin 113 may be connected to the second semiconductor pin 133 through a second transmission line L13. The third control pin 115 may be connected to the third semiconductor pin 135 through a third transmission line L15. The controller 10 may transmit a command/address signal CA to the semiconductor device 20 through the first transmission line L11 in order to control the semiconductor device 20. The controller 10 may receive transmission data TD from the semiconductor device 20 through the second transmission line L13 or may output the transmission data TD to the semiconductor device 20 through the second transmission line L13. The semiconductor device 20 may transmit an error log signal ELOG to the controller 10 through the second transmission line L13. The semiconductor device 20 may transmit an error log bank address ELBADD and an error log row address ELRADD to the controller 10 through the third transmission line L15. A configuration and an operation of the controller 10 will be described in more detail with reference to FIG. 14.

The command/address receiving circuit 210 may receive the command/address signal CA for executing various internal operations through the first transmission line L11. The various internal operations may include a read operation, a write operation, and a refresh operation. The command/address signal CA may include a command and an address. The command/address receiving circuit 210 may be inactivated to stop an operation for receiving the command/address signal CA when an ECS operation is performed. In the present embodiment, the ECS operation may be automatically performed when a refresh command has a value which is equal to or greater than a predetermined value. Because the command/address receiving circuit 210 is inactivated during the ECS operation, it may be possible to reduce power consumption of the semiconductor device 20 and to prevent malfunction of the semiconductor device 20 from occurring due to the command/address signal CA inputted to the command/address receiving circuit 210.

The ECS control circuit 230 may control the ECS operation based on the refresh command. The ECS operation may include an ECS read operation, an ECS error correction operation, and an ECS write operation. The ECS control circuit 230 may control the memory bank 250 and the error correction circuit 270 such that a codeword outputted from the memory bank 250 is transmitted to the error correction circuit 270 when the ECS read operation is performed. The codeword may include data and a parity. The parity may be generated from the data using an error correction code (ECC). When the ECS error correction operation is performed, the ECS control circuit 230 may control the error correction circuit 270 such that the error correction circuit 270 checks an error of the codeword outputted from the memory bank 250 and corrects the error of the codeword to generate a corrected codeword. When the corrected codeword is generated during the ECS error correction operation, the ECS control circuit 230 may control the memory bank 250 and the error correction circuit 270 such that the corrected codeword is stored into the memory bank 250 through the ECS write operation. When the corrected codeword is not generated during the ECS error correction operation, the ECS write operation is not performed. The ECS control circuit 230 may control the error log storage circuit 290 such that the error log storage circuit 290 stores information on the number of the errors after the ECS operations of all of the memory cells included in the memory bank 250 are performed. The ECS control circuit 230 may control the error log storage circuit 290 to compare the numbers of the errors of all of row paths with each other and to store information on the maximum number of the errors and information on a row path having the maximum number of the errors when the ECS operations of all of the memory cells included in the memory bank 250 are performed. The row path may mean at least one word line, which is activated during an active operation, among a plurality of word lines connected to the memory cells included in the memory bank 250.

The memory bank 250 may include a plurality of memory cells, and at least one of the plurality of memory cells may be selected by an address during the read operation, the ECS read operation, the write operation, the ECS write operation, and the refresh operation. The memory bank 250 may output the data included in a codeword stored in the memory cells selected by an address as the transmission data TD through the second transmission line L13 when the read operation is performed. The memory bank 250 may output the codeword stored in the memory cells selected by an address to the error correction circuit 270 when the ECS read operation is performed. The number of bits included in the data included in a codeword outputted from the memory bank 250 during the read operation and the ECS read operation may be set according to a burst length. The memory bank 250 may store a codeword into memory cells selected by an address when the write operation is performed. The memory bank 250 may store a corrected codeword generated by the error correction circuit 270 into memory cells selected by an address when the ECS write operation is performed. The number of bits included in data or corrected data included in the codeword stored in the memory bank 250 during the write operation and the ECS write operation may be set according to a burst length. The memory bank 250 may periodically restore the data of memory cells which are selected by an address when the refresh operation is performed.

The error correction circuit 270 may receive a codeword including data and a parity, which are stored in memory cells selected by an address, to detect an error of the codeword when the read operation or the ECS read operation is performed. The error correction circuit 270 may correct an error of the codeword to generate a corrected codeword when the error is detected from the codeword inputted to the error correction circuit 270 during the read operation or the ECS read operation. The error correction circuit 270 may generate an error flag (EFLAG of FIG. 2) to transmit the error flag EFLAG to the error log storage circuit 290 when the error of the codeword is detected during the ECS read operation. When the ECS write operation is performed, the error correction circuit 270 may store the corrected codeword into memory cells selected by an address. When the write operation is performed, the error correction circuit 270 may transmit the corrected codeword to the controller 10.

The error log storage circuit 290 may extract and store information on the numbers of the errors of the row paths, information on the maximum number of the errors, and information on a row path having the maximum number of the errors based on the error flag EFLAG when the ECS operations of all of the memory cells included in the memory bank 250 are sequentially performed. The error log storage circuit 290 may transmit the information on the numbers of the errors of the row paths, the information on the maximum number of the errors, and the information on a row path having the maximum number of the errors to the controller 10 through the second and third transmission lines L13 and L15 when an error log command (ELC of FIG. 2) is generated.

Figure 2:
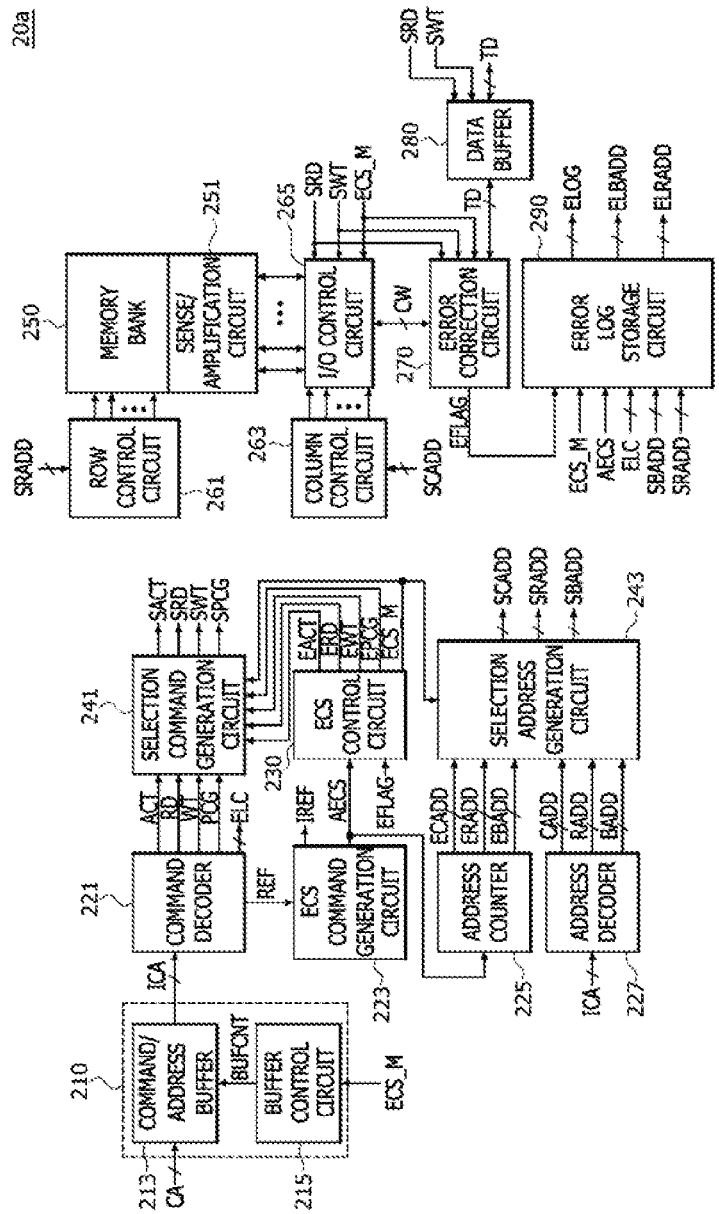
FIG. 2 is a block diagram, illustrating an example of a semiconductor device, included in the semiconductor system of FIG. 1.

FIG. 2 is a block diagram illustrating a configuration of a semiconductor device 20a corresponding to an example of the semiconductor device 20 included in the semiconductor system 1. The semiconductor device 20a may include the command/address receiving circuit 210, a command decoder 221, an ECS command generation circuit 223, an address counter 225, an address decoder 227, the ECS control circuit 230, a selection command generation circuit 241, a selection address generation circuit 243, the memory bank 250, a sense/amplification circuit 251, a row control circuit 261, a column control circuit 263, an I/O control circuit 265, the error correction circuit 270, a data buffer 280, and the error log storage circuit 290.

The command/address receiving circuit 210 may include a command/address buffer 213 and a buffer control circuit 215. The command/address buffer 213 may buffer the command/address signal CA received through the first transmission line L11 to generate an internal command/address signal ICA. The buffer control circuit 215 may generate a buffer control signal BUFCNT based on an ECS mode signal ECS_M when the ECS operation is performed. The command/address buffer 213 may receive the buffer control signal BUFCNT generated by the buffer control circuit 215 and may buffer the command/address signal CA to stop an operation for generating the internal command/address signal ICA when the ECS operation is performed. The number of bits included in the command/address signal CA and the internal command/address signal ICA may be set to be different according to the embodiments.

The command decoder 221 may decode the internal command/address signal ICA to generate a refresh command REF, an active command ACT, a read command RD, a write command WT, a pre-charge command PCG, and the error log command ELC. The refresh command REF may be generated to perform the refresh operation. The active command ACT may be generated to perform the active operation. The read command RD may be generated to perform the read operation. The write command WT may be generated to perform the write operation. The pre-charge command PCG may be generated to perform a pre-charge operation. The error log command ELC may be generated to store the number of memory cells storing a codeword including an error based on the error flag EFLAG and may be generated to store a selection bank address SBADD and a selection row address SRADD for selecting a row path having the maximum number of errors.

The ECS command generation circuit 223 may generate an ECS command AECS and an internal refresh command IREF based on the refresh command REF. The ECS command generation circuit 223 may generate the ECS command AECS whenever the refresh command REF is generated by the number of times corresponding to a predetermined set value. The ECS command generation circuit 223 may generate the internal refresh command IREF based on the refresh command REF when the ECS command AECS is not generated. For example, when the predetermined set value is a natural number 'K' which is equal to or more than two, the ECS command generation circuit 223 may generate the internal refresh command IREF until the refresh command REF is generated 'K−1' times and may generate the ECS command AECS when the refresh command REF is generated 'K' times. A configuration and an operation of the ECS command generation circuit 223 will be described in more detail with reference to FIGS. 3 and 4.

The address counter 225 may generate an ECS column address ECADD, an ECS row address ERADD, and an ECS bank address EBADD based on the ECS command AECS. The address counter 225 may count the ECS command AECS to control a logic level combination of the ECS column address ECADD, a logic level combination of the ECS row address ERADD, and a logic level combination of the ECS bank address EBADD. The number of bits included in each of the ECS column address ECADD, the ECS row address ERADD, and the ECS bank address EBADD may be set to be different according to the embodiments. The address counter 225 may count the ECS command AECS to sequentially increase a binary number corresponding to a logic level combination of bits included in the ECS column address ECADD, to sequentially increase a binary number corresponding to a logic level combination of bits included in the ECS row address ERADD, and to sequentially increase a binary number corresponding to a logic level combination of bits included in the ECS bank address EBADD. When each of the ECS column address ECADD, the ECS row address ERADD, and the ECS bank address EBADD includes two bits, the sequential increase of the logic level combination of each of the ECS column address ECADD, the ECS row address ERADD, and the ECS bank address EBADD may mean that the logic level combination of each of the ECS column address ECADD, the ECS row address ERADD, and the ECS bank address EBADD changes in order of '00', '01', '10', and '11. A configuration and an operation of the address counter 225 will be described in more detail with reference to FIG. 8.

The address decoder 227 may decode the internal command/address signal ICA to generate a column address CADD, a row address RADD, and a bank address BADD. The address decoder 227 may decode the internal command/address signal ICA to generate the column address CADD, the row address RADD, and the bank address BADD used for the internal operations including the active operation, the read operation, and the write operation.

The ECS control circuit 230 may generate the ECS mode signal ECS_M based on the ECS command AECS. The ECS mode signal ECS_M may be generated during a period that the ECS operation is performed. The ECS control circuit 230 may generate an ECS active command EACT, an ECS read command ERD, an ECS write command EWT, an ECS pre-charge command EPCG, and an ECS end command (ECS_END of FIG. 5) while the ECS operation is performed. The ECS control circuit 230 may count an internal clock signal (ICLK of FIG. 5) based on the error flag EFLAG to sequentially generate the ECS active command EACT, the ECS read command ERD, the ECS write command EWT, and the ECS pre-charge command EPCG while the ECS operation is performed. For example, the ECS control circuit 230 may generate the ECS active command EACT when the internal clock signal ICLK generated by the ECS command AECS is counted three times, may generate the ECS read command ERD when the internal clock signal ICLK is counted five times, may generate the ECS write command EWT when the internal clock signal ICLK is counted seven times, and may generate the ECS pre-charge command EPCG when the internal clock signal ICLK is counted ninth times. The number of times that the internal clock signal ICLK is counted to generate each of the ECS active command EACT, the ECS read command ERD, the ECS write command EWT, and the ECS pre-charge command EPCG may be set to be different according to the embodiments. When no error detects from a codeword outputted from the memory cells during the ECS error correction operation not to generate the error flag EFLAG, the ECS control circuit 230 does not generate the ECS write command EWT. A configuration and an operation of the ECS control circuit 230 will be described in more detail with reference to FIGS. 5 to 7.

The selection command generation circuit 241 may generate a selection active command SACT, a selection read command SRD, a selection write command SWT, and a selection pre-charge command SPCG from the active command ACT, the read command RD, the write command WT, the pre-charge command PCG, the ECS active command EACT, the ECS read command ERD, the ECS write command EWT, and the ECS pre-charge command EPCG based on the ECS mode signal ECS_M. The selection command generation circuit 241 may select and output the ECS active command EACT, the ECS read command ERD, the ECS write command EWT, and the ECS pre-charge command EPCG as the selection active command SACT, the selection read command SRD, the selection write command SWT, and the selection pre-charge command SPCG while the ECS operation is performed. The selection command generation circuit 241 may select and output the active command ACT, the read command RD, the write command WT, and the pre-charge command PCG as the selection active command SACT, the selection read command SRD, the selection write command SWT, and the selection pre-charge command SPCG while the ECS operation is not performed. A configuration and an operation of the selection command generation circuit 241 will be described in more detail with reference to FIG. 9.

The selection address generation circuit 243 may generate a selection column address SCADD, a selection row address SRADD, and a selection bank address SBADD from the ECS column address ECADD, the ECS row address ERADD, the ECS bank address EBADD, the column address CADD, the row address RADD, and the bank address BADD based on the ECS mode signal ECS_M. The selection address generation circuit 243 may select and output the ECS column address ECADD, the ECS row address ERADD, and the ECS bank address EBADD as the selection column address SCADD, the selection row address SRADD, and the selection bank address SBADD while the ECS operation is performed. The selection address generation circuit 243 may select and output the column address CADD, the row address RADD, and the bank address BADD as the selection column address SCADD, the selection row address SRADD, and the selection bank address SBADD while the ECS operation is not performed. A configuration and an operation of the selection address generation circuit 243 will be described in more detail with reference to FIG. 10.

The memory bank 250 may include a plurality of memory cells, and each of the memory cells may be coupled to any one of word lines and any one of bit lines. One of the word lines connected to the memory cells included in the memory bank 250 may be selected by the selection row address SRADD. At least one of the bit lines connected to the memory cells included in the memory bank 250 may be selected by the selection column address SCADD. At least one of the memory cells may be accessed by selecting one of the word lines and at least one of the bit lines. The number of the word lines coupled to the memory cells included in the memory bank 250 and the number of the bit lines coupled to the memory cells included in the memory bank 250 may be set to be different according to the embodiments. A configuration and an operation of the memory bank 250 will be described in more detail with reference to FIG. 11. Although the present embodiment describes in conjunction with a case that the ECS operation is performed for the memory cells included in only the memory bank 250 selected by the selection bank address SBADD for the purpose of ease and convenience in explanation, the present disclosure is not limited thereto. For example, in some other embodiments, the semiconductor device 20a may be realized such that the ECS operation is performed for memory cells included in one of a plurality of memory banks, which is selected by the selection bank address SBADD.

The sense/amplification circuit 251 may include a plurality of sense amplifiers (not shown). The sense amplifiers included in the sense/amplification circuit 251 may be connected to the memory cells included in the memory bank 250 and may sense and amplify levels of data signals loaded on the bit lines.

The row control circuit 261 may select one of the word lines coupled to the memory cells included in the memory bank 250 as a row path based on the selection row address SRADD. The row control circuit 261 may perform the active operation for loading a codeword stored in the memory cells in a row path selected by the selection row address SRADD on the bit lines such that the sense/amplification circuit 251 senses and amplifies data signals of the codeword.

The column control circuit 263 may control the I/O control circuit 265 such that the codeword is inputted to or outputted from the sense amplifiers selected by the selection column address SCADD among the plurality of sense amplifiers coupled to the memory cells in the row path. The column control circuit 263 may control the I/O control circuit 265 such that the read operation and the write operation are performed for the memory cells coupled to the sense amplifiers selected by the selection column address SCADD among the plurality of memory cells included in a memory bank performing the active operation.

The I/O control circuit 265 may be coupled between the sense/amplification circuit 251 and the error correction circuit 270 to control input or output of a codeword based on the selection read command SRD, the selection write command SWT, and the ECS mode signal ECS_M. The I/O control circuit 265 may output a codeword CW including data and a parity outputted from the memory bank 250 to the error correction circuit 270 during the read operation or the ECS read operation. The I/O control circuit 265 may output the codeword CW received from the error correction circuit 270 to the memory bank 250 during the write operation or the ECS write operation.

The error correction circuit 270 may receive the codeword CW from the I/O control circuit 265 or may output the codeword CW to the I/O control circuit 265 based on the selection read command SRD, the selection write command SWT, and the ECS mode signal ECS_M. The error correction circuit 270 may receive the transmission data TD from the data buffer 280 or may output the transmission data TD to the data buffer 280 based on the selection read command SRD, the selection write command SWT, and the ECS mode signal ECS_M. The error correction circuit 270 may generate the error flag EFLAG based on the codeword CW. When the read operation is performed, the error correction circuit 270 may receive the codeword CW from the I/O control circuit 265 and may decode the codeword CW to generate the error flag EFLAG and to output data included in the codeword CW corrected by the error correction circuit 270 as the transmission data TD through the data buffer 280 if an error is detected from the codeword CW. When the write operation is performed, the error correction circuit 270 may encode the transmission data TD received from the data buffer 280 to generate the codeword CW including data and a parity and may transmit the codeword CW to the I/O control circuit 265 to store the codeword CW into the memory bank 250. When the ECS read operation is performed, the error correction circuit 270 may receive the codeword CW from the I/O control circuit 265 and may decode the codeword CW to generate the error flag EFLAG and the codeword CW corrected by the error correction circuit 270 if an error is detected from the codeword CW. The error correction circuit 270 may generate the corrected codeword CW during the ECS read operation, and the error correction circuit 270 may transmit the corrected codeword CW to the I/O control circuit 265 to store the corrected codeword CW into the memory bank 250 during the ECS write operation. A configuration and an operation of the error correction circuit 270 will be described in more detail with reference to FIG. 12.

The data buffer 280 may receive the transmission data TD from the error correction circuit 270 or may output the transmission data TD to the error correction circuit 270 based on the selection read command SRD and the selection write command SWT. The data buffer 280 may receive the transmission data TD from the controller (10 of FIG. 1) or may output the transmission data TD to the controller (10 of FIG. 1) based on the selection read command SRD and the selection write command SWT. When the writ operation is performed, the data buffer 280 may transmit the transmission data TD received through the second transmission line (L13 of FIG. 1) to the error correction circuit 270. When the read operation is performed, the data buffer 280 may transmit the transmission data TD received from the error correction circuit 270 to the controller 10 through the second transmission line L13.

The error log storage circuit 290 may generate an error log signal ELOG, an error log row address ELRADD, and an error log bank address ELBADD based on the error flag EFLAG, the ECS mode signal ECS_M, the ECS command AECS, the error log command ELC, the selection row address SRADD, and the selection bank address SBADD. The error log storage circuit 290 may output information on the number of errors detected based on the error flag EFLAG as the error log signal ELOG when the ECS operations are performed for all of the memory cells included in the memory bank 250. When the ECS operations are performed for all of the memory cells included in the memory bank 250, the error log storage circuit 290 may compare the numbers of the errors of all of the row paths with each other based on the error flag EFLAG, the selection row address SRADD, and the selection bank address SBADD to output information on the maximum number of the errors as the error log signal ELOG and to output information on the row path having the maximum number of the errors as the error log row address ELRADD and the error log bank address ELBADD. The error log storage circuit 290 may transmit the error log signal ELOG to the controller 10 through the second transmission line L13. The error log storage circuit 290 may transmit the error log row address ELRADD and the error log bank address ELBADD to the controller 10 through the third transmission line L15. A configuration and an operation of the error log storage circuit 290 will be described in more detail with reference to FIG. 13.

Figure 3:
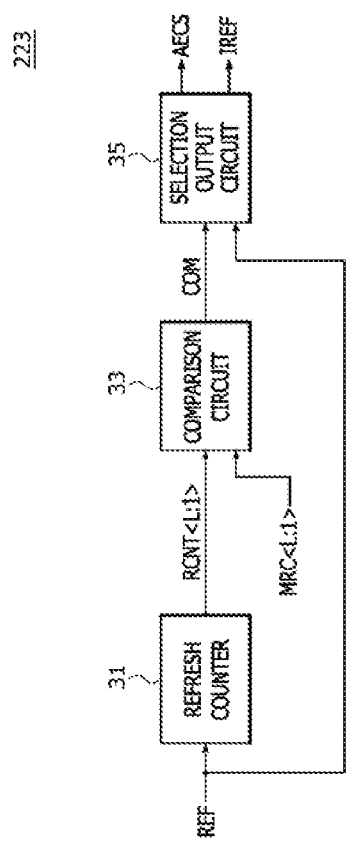
FIG. 3 is a block diagram, illustrating an example of an error check and scrub (ECS) command generation circuit, included in the semiconductor device of FIG. 2.

FIG. 3 is a block diagram illustrating an ECS command generation circuit 223 included in the semiconductor device 20a. As illustrated in FIG. 3, the ECS command generation circuit 223 may include a refresh counter 31, a comparison circuit 33, and a selection output circuit 35.

The refresh counter 31 may count the refresh command REF to generate a refresh count signal RCNT<L:1>. The refresh counter 31 may increase a logic level combination of bits included in the refresh count signal RCNT<L:1> whenever the refresh command REF is inputted to the refresh counter 31. The number "L" of bits included in the refresh count signal RCNT<L:1> may be set to be a natural number which is equal to or greater than two. For example, when the number "L" is set to be two, a logic level combination of the refresh count signal RCNT<L:1> may change to increase in order of '00', '01', '10', and '11 whenever the refresh command REF is inputted to the refresh counter 31. In the refresh count signal RCNT<2:1> having two bits, the logic level combination of '01' means that the second bit RCNT<2> of the refresh count signal RCNT<2:1> has a logic "low" level and the first bit RCNT<1> of the refresh count signal RCNT<2:1> has a logic "high" level.

The comparison circuit 33 may compare the refresh count signal RCNT<L:1> with a set signal MRC<L:1> to generate a comparison signal COM. The comparison circuit 33 may generate the comparison signal COM, a logic level of which is determined according to whether a logic level combination of the refresh count signal RCNT<L:1> is identical to a logic level combination of the set signal MRC<L:1>. The comparison signal COM may be generated to have a first logic level when a logic level combination of the refresh count signal RCNT<L:1> is identical to a logic level combination of the set signal MRC<L:1> and to have a second logic level when a logic level combination of the refresh count signal RCNT<L:1> is different from a logic level combination of the set signal MRC<L:1>. The set signal MRC<L:1> may have a logic level combination corresponding to the set value and may be stored into a mode register by a mode register set (MRS). In the present embodiment, the first logic level may be set as a logic "high" level, and second logic level may be set as a logic "low" level.

The selection output circuit 35 may generate the ECS command AECS and the internal refresh command IREF based on the comparison signal COM and the refresh command REF. The selection output circuit 35 may output the refresh command REF as the ECS command AECS when the comparison signal COM is generated to have the first logic level because the refresh count signal RCNT<L:1> and the set signal MRC<L:1> have the same logic level combination. The selection output circuit 35 may output the refresh command REF as the internal refresh command IREF when the comparison signal COM is generated to have the second logic level because the refresh count signal RCNT<L:1> and the set signal MRC<L:1> have different logic level combinations.

Figure 4:
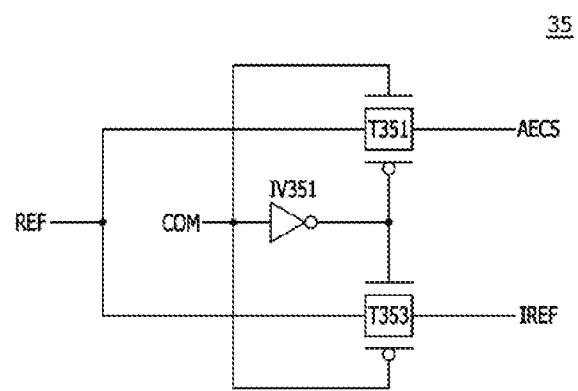
FIG. 4 is a circuit diagram, illustrating an example of a selection output circuit, included in the ECS command generation circuit of FIG. 3.

FIG. 4 is a circuit diagram illustrating the selection output circuit 35 included in the ECS command generation circuit 223. As illustrated in FIG. 4, the selection output circuit 35 may include an inverter IV351 and transfer gates T351 and T353. The inverter IV351 may inversely buffer the comparison signal COM to output the inversely buffered signal of the comparison signal COM. The transfer gate T351 may be turned on to output the refresh command REF as the ECS command AECS when the comparison signal COM has a logic "high" level. The transfer gate T351 may be turned on to output the refresh command REF as the internal refresh command IREF when the comparison signal COM has a logic "low" level.

Figure 5:
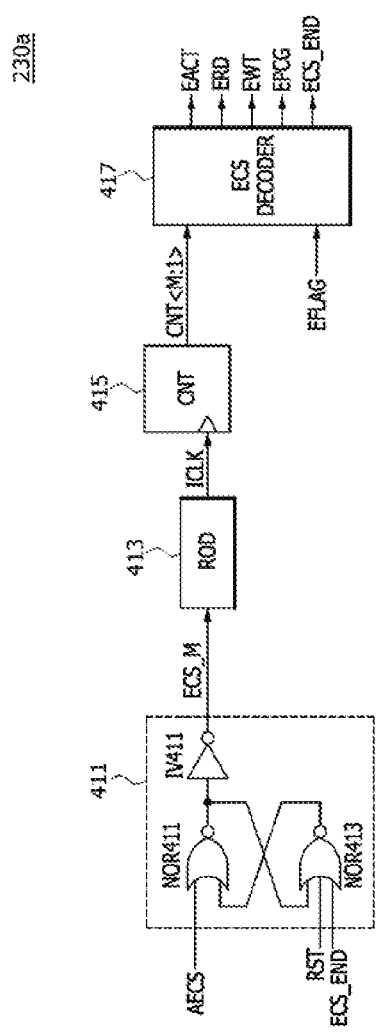
FIG. 5 illustrates an example of an ECS control circuit that is included in the semiconductor device of FIG. 2.

FIG. 5 illustrates an ECS control circuit 230a corresponding to an example of the ECS control circuit 230 included in the semiconductor device 20a. As illustrated in FIG. 5, the ECS control circuit 230a may include an ECS mode signal generation circuit 411, an internal clock generation circuit 413, an ECS counter 415, and an ECS decoder 417.

The ECS mode signal generation circuit 411 may include NOR gates NOR411 and NOR413 and an inverter IV411. The NOR gate NOR411 may receive the ECS command AECS and an output signal of the NOR gate NOR413 to perform a logical NOR operation of the ECS command AECS and the output signal of the NOR gate NOR413. The NOR gate NOR413 may receive a reset signal RST, the ECS end command ECS_END, and an output signal of the NOR gate NOR411 to perform a logical NOR operation of the reset signal RST, the ECS end command ECS_END, and the output signal of the NOR gate NOR411. The inverter IV411 may inversely buffer the output signal of the NOR gate NOR411 to generate the ECS mode signal ECS_M. The ECS mode signal generation circuit 411 may generate the ECS mode signal ECS_M based on the ECS command AECS, the reset signal RST, and the ECS end command ECS_END. The ECS mode signal generation circuit 411 may generate the ECS mode signal ECS_M having a logic "high" level when the ECS command AECS is generated to have a logic "high" level. The ECS mode signal generation circuit 411 may change a logic level of the ECS mode signal ECS_M from a logic "high" level into a logic "low" level when the reset signal RST or the ECS end command ECS_END is generated to have a logic "high" level. The reset signal RST may be generated to have a logic "high" level for an initialization operation of the semiconductor device 20.

The internal clock generation circuit 413 may generate the internal clock signal ICLK based on the ECS mode signal ECS_M. The internal clock generation circuit 413 may generate the internal clock signal ICLK while the ECS mode signal ECS_M has a logic "high" level. The internal clock generation circuit 413 may stop generation of the internal clock signal ICLK when the ECS mode signal ECS_M has a logic "low" level. The internal clock generation circuit 413 may include an oscillator.

The ECS counter 415 may count the internal clock signal ICLK to generate a count signal CNT<M:1>. The ECS counter 415 may be synchronized with a rising edge (or a falling edge according to the embodiments) of the internal clock signal ICLK to increase a binary number corresponding to a logic level combination of the count signal CNT<M:1>. The number "M" of bits included in the count signal CNT<M:1> may be set to be a natural number which is equal to or greater than two. For example, when the number "M" is set as four, the count signal CNT<4:1> may be counted up bit by bit to have logic level combinations of '0000', '0001', '0010', '0011', '0100', . . . , and '1111' in sequence whenever a logic level of the internal clock signal ICLK changes from a logic "low" level into a logic "high" level. In the count signal CNT<4:1>, the logic level combination of '0001' means that fourth to second bits CNT<4:2> of the count signal CNT<4:1> have a logic "low" level and the first bit CNT<1> of the count signal CNT<4:1> has a logic "high" level.

The ECS decoder 417 may generate the ECS active command EACT, the ECS read command ERD, the ECS write command EWT, the ECS pre-charge command EPCG, and the ECS end command ECS_END based on the count signal CNT<M:1> and the error flag EFLAG. The ECS decoder 417 may sequentially generate the ECS active command EACT, the ECS read command ERD, the ECS write command EWT, the ECS pre-charge command EPCG, and the ECS end command ECS_END according to a logic level combination of the count signal CNT<M:1>. For example, the ECS decoder 417 may generate the ECS active command EACT when the count signal CNT<M:1> has a logic level combination of '0011', may generate the ECS read command ERD when the count signal CNT<M:1> has a logic level combination of '0101', may generate the ECS write command EWT when the count signal CNT<M:1> has a logic level combination of '0111', may generate the ECS pre-charge command EPCG when the count signal CNT<M:1> has a logic level combination of '1001', and may generate the ECS end command ECS_END when the count signal CNT<M:1> has a logic level combination of '1011'. The ECS decoder 417 may stop generation of the ECS write command EWT when the error flag EFLAG is generated by an error detected from the codeword stored in the selected memory cells.

Figure 6:
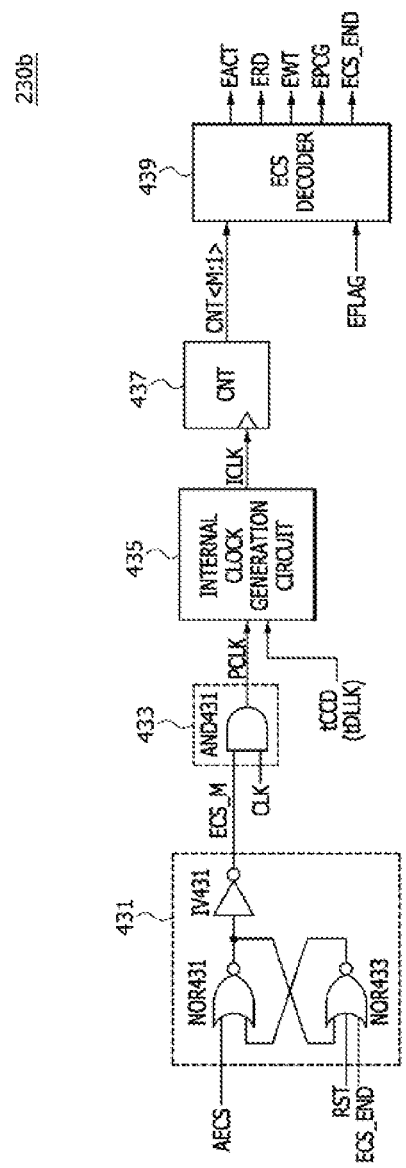
FIG. 6 illustrates another example of an ECS control circuit that is included in the semiconductor device of FIG. 2.

FIG. 6 illustrates an ECS control circuit 230b corresponding to another example of the ECS control circuit 230 included in the semiconductor device 20a. As illustrated in FIG. 6, the ECS control circuit 230b may include an ECS mode signal generation circuit 431, a pre-clock generation circuit 433, an internal clock generation circuit 435, an ECS counter 437, and an ECS decoder 439.

The ECS mode signal generation circuit 431 may include NOR gates NOR431 and NOR433 and an inverter IV431. The NOR gate NOR431 may receive the ECS command AECS and an output signal of the NOR gate NOR433 to perform a logical NOR operation of the ECS command AECS and the output signal of the NOR gate NOR433. The NOR gate NOR433 may receive the reset signal RST, the ECS end command ECS_END, and an output signal of the NOR gate NOR431 to perform a logical NOR operation of the reset signal RST, the ECS end command ECS_END, and the output signal of the NOR gate NOR431. The inverter IV431 may inversely buffer the output signal of the NOR gate NOR431 to generate the ECS mode signal ECS_M. The ECS mode signal generation circuit 431 may generate the ECS mode signal ECS_M based on the ECS command AECS, the reset signal RST, and the ECS end command ECS_END. The ECS mode signal generation circuit 431 may generate the ECS mode signal ECS_M having a logic "high" level when the ECS command AECS is generated to have a logic "high" level. The ECS mode signal generation circuit 431 may change a logic level of the ECS mode signal ECS_M from a logic "high" level into a logic "low" level when the reset signal RST or the ECS end command ECS_END is generated to have a logic "high" level.

The pre-clock generation circuit 433 may include an AND gate AND431. The pre-clock generation circuit 433 may perform a logical AND operation of the ECS mode signal ECS_M and an external clock signal CLK to generate a pre-clock signal PCLK. The external clock signal CLK may be provided by the controller (10 of FIG. 1). The pre-clock generation circuit 433 may buffer the external clock signal CLK to output the buffered signal of the external clock signal CLK as the pre-clock signal PCLK while the ECS operation is performed by the ECS mode signal ECS_M having a logic "high" level. The pre-clock generation circuit 433 may output the pre-clock signal PCLK having a logic "low" level when the ECS operation is not performed by the ECS mode signal ECS_M having a logic "low" level.

The internal clock generation circuit 435 may generate the internal clock signal ICLK based on the pre-clock signal PCLK and an operation speed flag tCCD or tDLLK. The internal clock generation circuit 435 may control a cycle of the pre-clock signal PCLK according to the speed flag tCCD or tDLLK to generate the internal clock signal ICLK. The speed flag tCCD or tDLLK may be set to be different according to a range of data rate. Referring to FIG. 7, when the data rate is within the range of 2,000 Mbps to 3,200 Mbps, the speed flag tCCD (CAS to CAS Delay period) may be set as '8' and the speed flag tDLLK (delay locked clock period) may be set as '1024'. In addition, as the data rate increases, the speed flag tCCD or tDLLK may also increase.

The internal clock generation circuit 435 may generate the internal clock signal ICLK by increasing a cycle of the pre-clock signal PCLK because a cycle of the external clock signal CLK is reduced by the speed flag tCCD or tDLLK when the data rate increases. The internal clock generation circuit 435 may generate the internal clock signal ICLK by reducing a cycle of the pre-clock signal PCLK because a cycle of the external clock signal CLK increases by the speed flag tCCD or tDLLK when the data rate decrease. Because the internal clock generation circuit 435 controls a cycle of the pre-clock signal PCLK to generate the internal clock signal ICLK even though the data rate varies, the internal clock generation circuit 435 may generate the internal clock signal ICLK having a constant cycle regardless of variation of the data rate. The internal clock generation circuit 435 may include a ring oscillator.

The ECS counter 437 may count the internal clock signal ICLK to generate the count signal CNT<M:1>. The ECS counter 437 may be synchronized with a rising edge (or a falling edge according to the embodiments) of the internal clock signal ICLK to increase a binary number corresponding to a logic level combination of the count signal CNT<M:1>.

The ECS decoder 439 may generate the ECS active command EACT, the ECS read command ERD, the ECS write command EWT, the ECS pre-charge command EPCG, and the ECS end command ECS_END based on the count signal CNT<M:1> and the error flag EFLAG. The ECS decoder 439 may sequentially generate the ECS active command EACT, the ECS read command ERD, the ECS write command EWT, the ECS pre-charge command EPCG, and the ECS end command ECS_END according to a logic level combination of the count signal CNT<M:1>.

Figure 8:
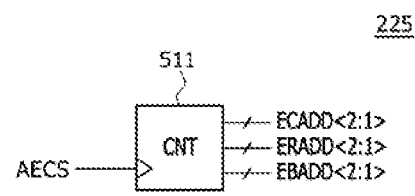
FIG. 8 illustrates an example of an address counter that is included in the semiconductor device of FIG. 2.

FIG. 8 illustrates the address counter 225 included in the semiconductor device 20a. As illustrated in FIG. 8, the address counter 225 may include a counter 511 that counts the ECS command AECS to generate the ECS column address ECADD<2:1>, the ECS row address ERADD<2:1>, and the ECS bank address EBADD<2:1>. The counter 511 may sequentially increase a logic level combination of the ECS column address ECADD<2:1>, a logic level combination of the ECS row address ERADD<2:1>, and a logic level combination of the ECS bank address EBADD<2:1> whenever the ECS command AECS is inputted to the counter 511. For example, whenever the ECS command AECS is inputted to the counter 511, the counter 511 may sequentially increase a logic level combination of the ECS column address ECADD<2:1> in order of '00', '01', '10', and '11', may sequentially increase a logic level combination of the ECS row address ERADD<2:1> in order of '00', '01', '10', and '11' after sequentially increasing the logic level combination of the ECS column address ECADD<2:1>, and may sequentially increase a logic level combination of the ECS bank address ERADD<2:1> in order of '00' and '01' after sequentially increasing the logic level combination of the ECS row address ERADD<2:1>. That is, a row path next to a certain row path may be selected after all of column paths connected to memory cells in the certain row path are sequentially selected, and a memory bank next to a certain memory bank may be selected after all of row paths included in the certain memory bank are sequentially selected. The present embodiment describes in conjunction with a case that the ECS operations are performed for only the memory cells included in the memory bank 250. In such a case, the row path may mean at least one word line, which is selected by the ECS row address ERADD, among a plurality of word lines included in the memory bank 250, and the column path may mean at least one bit line (or at least one sense amplifier), which is selected by the ECS column address ECADD, among a plurality of bit lines (or a plurality of sense amplifiers) coupled to memory cells arrayed in one row path.

Figure 9:
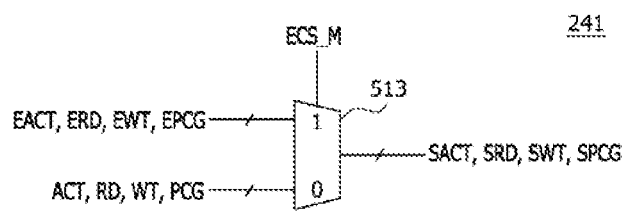
FIG. 9 illustrates an example of a selection command generation circuit that is included in the semiconductor device of FIG. 2.

FIG. 9 illustrates the selection command generation circuit 241 included in the semiconductor device 20a. As illustrated in FIG. 9, the selection command generation circuit 241 may include a command selector 513 that generates the selection active command SACT, the selection read command SRD, the selection write command SWT, and the selection pre-charge command SPCG from the active command ACT, the read command RD, the write command WT, the pre-charge command PCG, the ECS active command EACT, the ECS read command ERD, the ECS write command EWT, and the ECS pre-charge command EPCG based on the ECS mode signal ECS_M. The command selector 513 may select and output the ECS active command EACT, the ECS read command ERD, the ECS write command EWT, and the ECS pre-charge command EPCG as the selection active command SACT, the selection read command SRD, the selection write command SWT, and the selection pre-charge command SPCG during a period that the ECS operation is performed. The command selector 513 may select and output the active command ACT, the read command RD, the write command WT, and the pre-charge command PCG as the selection active command SACT, the selection read command SRD, the selection write command SWT, and the selection pre-charge command SPCG during a period that the ECS operation is not performed.

Figure 10:
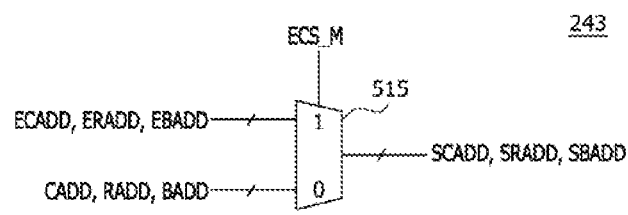
FIG. 10 illustrates an example of a selection address generation circuit that is included in the semiconductor device of FIG. 2.

FIG. 10 illustrates the selection address generation circuit 243 included in the semiconductor device 20a. As illustrated in FIG. 10, the selection address generation circuit 243 may include an address selector 515 that generates the selection column address SCADD, the selection row address SRADD, and the selection bank address SBADD from the ECS column address ECADD, the ECS row address ERADD, the ECS bank address EBADD, the column address CADD, the row address RADD, and the bank address BADD based on the ECS mode signal ECS_M. The address selector 515 may select and output the ECS column address ECADD, the ECS row address ERADD, and the ECS bank address EBADD as the selection column address SCADD, the selection row address SRADD, and the selection bank address SBADD during a period that the ECS operation is performed. The address selector 515 may select and output the column address CADD, the row address RADD, and the bank address BADD as the selection column address SCADD, the selection row address SRADD, and the selection bank address SBADD during a period that the ECS operation is not performed.

Figure 11:
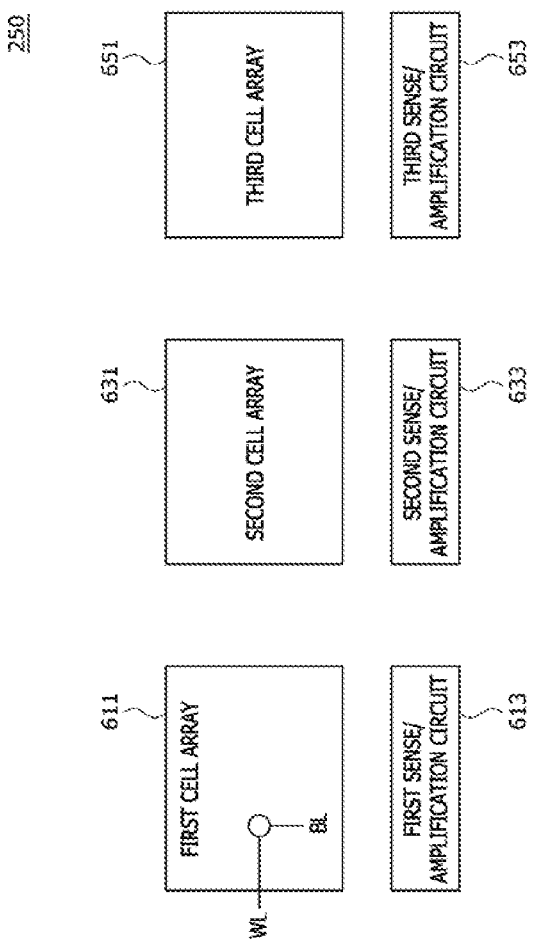
FIG. 11 is a block diagram, illustrating an example of a memory bank, included in the semiconductor device of FIG. 2.

FIG. 11 is a block diagram illustrating a configuration of the memory bank 250 included in the semiconductor device 20a. As illustrated in FIG. 11, the memory bank 250 may include a first cell array 611, a first sense/amplification circuit 613, a second cell array 631, a second sense/amplification circuit 633, a third cell array 651, and a third sense/amplification circuit 653. Each of the first, second, and third cell arrays 611, 631, and 651 may include a plurality of memory cells connected to word lines WL and bit lines BL. The number of memory cells included in each of the first, second, and third cell arrays 611, 631, and 651 may be set to be different according to the embodiments. Data and parities may be stored in each of the first, second, and third cell arrays 611, 631, and 651. Alternatively, the data or the parities may be stored in each of the first, second, and third cell arrays 611, 631, and 651. At least one the first, second, and third cell arrays 611, 631, and 651 may be used as a redundancy cell array during a repair operation for replacing erroneous memory cells with redundant memory cells in the redundancy cell array. The first sense/amplification circuit 613 may include sense amplifiers connected to the bit lines included in the first cell array 611. The second sense/amplification circuit 633 may include sense amplifiers connected to the bit lines included in the second cell array 631. The third sense/amplification circuit 653 may include sense amplifiers connected to the bit lines included in the third cell array 651.

Figure 12:
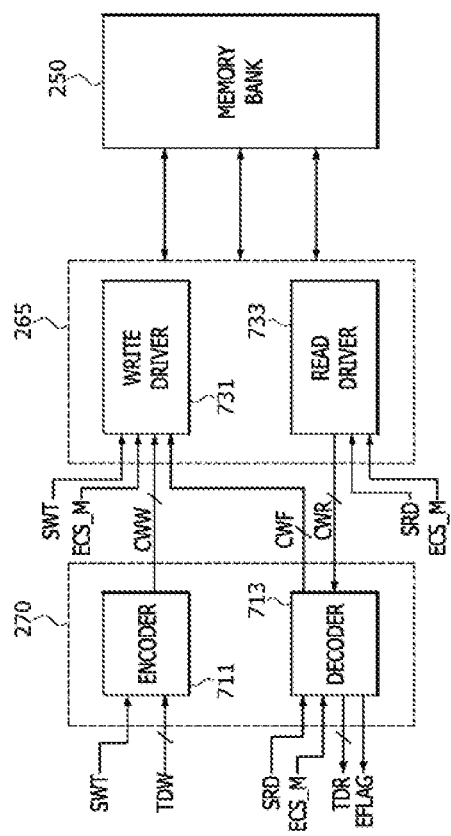
FIG. 12 is a block diagram, illustrating a memory bank, an input/output (I/O) control circuit, and an error correction circuit included in the semiconductor device of FIG. 2.

FIG. 12 is a block diagram illustrating the memory bank 250, the I/O control circuit 265, and the error correction circuit 270 included in the semiconductor device 20a. The error correction circuit 270 may include an encoder 711 and a decoder 713. The encoder 711 may generate a write codeword CWW based on the selection write command SWT and write transmission data TDW. The decoder 713 may generate read transmission data TDR, the error flag EFLAG, and a corrected codeword CWF based on the selection read command SRD, the ECS mode signal ECS_M, and a read codeword CWR. The I/O control circuit 265 may include a write driver 731 and a read driver 733. The write driver 731 may store the write codeword CWW or the corrected codeword CWF into the memory bank 250 based on the selection write command SWT and the ECS mode signal ECS_M. The read driver 733 may transmit the read codeword CWR outputted from the memory bank 250 to the decoder 713. The write operation, the read operation, and the ECS operation of the semiconductor device 20a having the aforementioned configuration will be described hereinafter.

When the write operation is performed, the encoder 711 may encode the write transmission data TDW to generate the write codeword CWW and to transmit the write codeword CWW to the write driver 731. The write transmission data TDW may correspond to the transmission data (TD of FIG. 2) outputted from the data buffer (280 of FIG. 2) during the write operation. The encoder 711 may generate a parity from the write transmission data TDW using a Hamming code and may generate the write codeword CWW including the write transmission data TDW and the parity. The write codeword CWW may correspond to a codeword used during the write operation. The write driver 731 may store the write codeword CWW into the memory bank 250.

When the read operation is performed, the read driver 733 may transmit the read codeword CWR including the data and the parity stored in the memory bank 250 to the decoder 713. The decoder 713 may correct an error of the read codeword CWR to output corrected data as the read transmission data TDR.

When the ECS operation is performed, the read driver 733 may transmit the read codeword CWR including the data and the parity stored in the memory bank 250 to the decoder 713. The read codeword CWR may correspond to a codeword used during the read operation. The decoder 713 may correct an error of the read codeword CWR to generate the corrected codeword CWF including corrected data and a parity and to output the corrected codeword CWF to the write driver 731. The write driver 731 may store the corrected codeword CWF into the memory bank 250.

Figure 13:
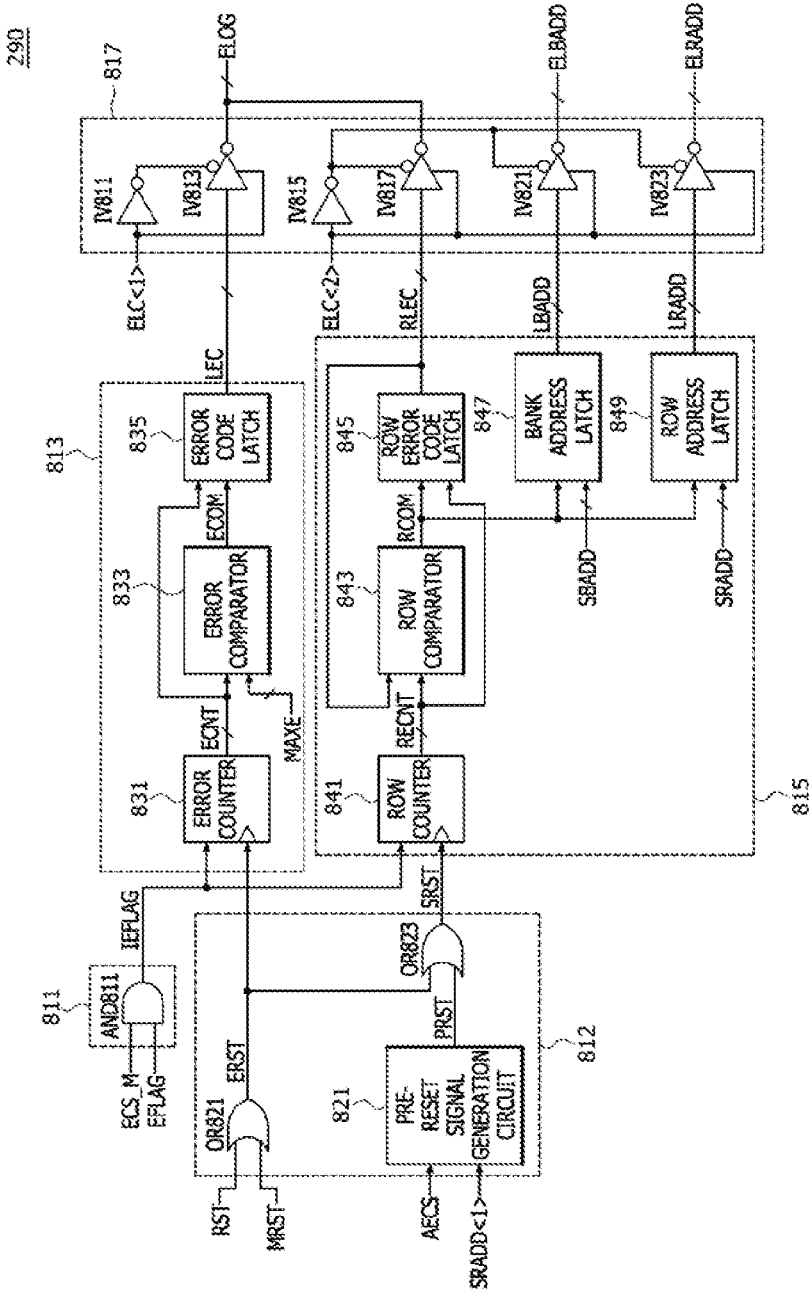
FIG. 13 illustrates an example of an error log storage circuit that is included in the semiconductor device of FIG. 2.

FIG. 13 illustrates a configuration of the error log storage circuit 290 included in the semiconductor device 20a. As illustrated in FIG. 13, the error log storage circuit 290 may include an internal error flag generation circuit 811, a selection reset signal generation circuit 812, an error log control circuit 813, a row error log control circuit 815, and an error log output circuit 817.

The internal error flag generation circuit 811 may include an AND gate AND811. The AND gate AND811 may perform a logical AND operation of the ECS mode signal ECS_M and the error flag EFLAG to generate an internal error flag IEFLAG. The internal error flag generation circuit 811 may generate the internal error flag IEFLAG having a logic "high" level when the error flag EFLAG having a logic "high" level is generated by an error detected from a codeword stored in the memory cells selected while the ECS mode signal ECS_M has a logic "high" level to perform the ECS operation.

The selection reset signal generation circuit 812 may include OR gates OR821 and OR823 and a pre-reset signal generation circuit 821. The OR gate OR821 may perform a logical OR operation of the reset signal RST and a mode register reset signal MRST to generate an error reset signal ERST. The OR gate OR821 may generate the error reset signal ERST having a logic "high" level when the reset signal RST or the mode register reset signal MRST is generated to have a logic "high" level. The mode register reset signal MRST may be generated to have a logic "high" level to reset a mode register (not shown). The pre-reset signal generation circuit 821 may generate a pre-reset signal PRST based on the ECS command AECS and a first bit SRADD<1> of the selection row address SRADD. The pre-reset signal generation circuit 821 may generate the pre-reset signal PRST having a logic "high" level when the ECS operations are performed for memory cells connected to a row path next to a certain row path after the ECS operations are performed for memory cells connected to the certain row path included in the memory bank 250. The OR gate OR823 may perform a logical OR operation of the error reset signal ERST and the pre-reset signal PRST to generate a selection reset signal SRST. The OR gate OR823 may generate the selection reset signal SRST having a logic "high" level when the error reset signal ERST or the pre-reset signal PRST is generate to have a logic "high" level.

The selection reset signal generation circuit 812 may generate the error reset signal ERST having a logic "high" level and the selection reset signal SRST having a logic "high" level when the reset signal RST or the mode register reset signal MRST is generated to have a logic "high" level after the ECS operations are performed for all of memory cells included in the memory bank 250. The selection reset signal generation circuit 812 may generate the selection reset signal SRST having a logic "high" level when the ECS operations are performed for memory cells connected to a row path next to a certain row path after the ECS operations are performed for all of memory cells connected to the certain row path included in the memory bank 250.

The error log control circuit 813 may include an error counter 831, an error comparator 833, and an error code latch 835. The error counter 831 may count the internal error flag IEFLAG to generate an error count signal ECNT. The error counter 831 may count up the error count signal ECNT whenever the internal error flag IEFLAG having a logic "high" level is generated by an error detected from a codeword stored in memory cells for which the ECS operation is performed. The error counter 831 may initialize the error count signal ECNT when the error rest signal ERST is generated to have a logic "high" level. The error comparator 833 may compare the error count signal ECNT with a maximum error value MAXE to generate an error comparison signal ECOM. The error comparator 833 may generate the error comparison signal ECOM having a first logic level when the error count signal ECNT increases to have a value which is equal to or greater than the maximum error value MAXE. The error comparator 833 may generate the error comparison signal ECOM having a second logic level when the error count signal ECNT has a value which is less than the maximum error value MAXE. The error code latch 835 may latch the error count signal ECNT based on the error comparison signal ECOM to generate a latched error code LEC. The error code latch 835 may latch the error count signal ECNT to output the latched signal of the error count signal ECNT as the latched error code LEC when the error comparison signal ECOM having the first logic level is generated by the error count signal ECNT having a value which is equal to or greater than the maximum error value MAXE. The maximum error value MAXE may be stored into a mode register by a mode register set.

The error log control circuit 813 may latch the error count signal ECNT to output the latched signal of the error count signal ECNT as the latched error code LEC when the number of errors detected during the ECS operations is equal to or greater than the maximum error value MAXE after the ECS operations are performed for all of memory cells included in the memory bank 250.

The row error log control circuit 815 may include a row counter 841, a row comparator 843, a row error code latch 845, a bank address latch 847, and a row address latch 849. The row counter 841 may count the internal error flag IEFLAG to generate a row error count signal RECNT. The row counter 841 may increase the row error count signal RECNT whenever the internal error flag IEFLAG is generated to have a logic "high" level by an error detected from a codeword stored in memory cells when the ECS operations are performed for all of memory cells included in one row path. The row counter 841 may initialize the row error count signal RECNT if the selection rest signal SRST is generated to have a logic "high" level when the ECS operations are performed for a row path next to a certain row path after the ECS operations are performed for memory cells included in the certain row path. The row comparator 843 may compare the row error count signal RECNT with a row latch error code RLEC to generate a row comparison signal RCOM. The row comparator 843 may generate the row comparison signal RCOM having the first logic level when the row error count signal RECNT increases to have a value which is equal to or greater than the row latch error code RLEC. The row comparator 843 may generate the row comparison signal RCOM having the second logic level when the row error count signal RECNT has a value which is less than the row latch error code RLEC. The row error code latch 845 may latch the row error count signal RECNT based on the row comparison signal RCOM to generate the row latch error code RLEC. The row error code latch 845 may latch the row error count signal RECNT to output the latched signal of the row error count signal RECNT as the row latch error code RLEC when the row comparison signal RCOM having the first logic level is generated by the row error count signal RECNT having a value which is equal to or greater than the row latch error code RLEC. The bank address latch 847 may generate a latched bank address LBADD from the selection bank address SBADD based on the row comparison signal RCOM. The bank address latch 847 may latch the selection bank address SBADD when the row comparison signal RCOM has the first logic level and may output the latched address of the selection bank address SBADD as the latched bank address LBADD. The row address latch 849 may generate a latched row address LRADD from the selection row address SRADD based on the row comparison signal RCOM. The row address latch 849 may latch the selection row address SRADD when the row comparison signal RCOM has the first logic level and may output the latched address of the selection row address SRADD as the latched row address LRADD.

The row error log control circuit 815 may compare the numbers of the errors of all of the row paths with each other to output the information on the maximum number of the errors as the row latch error code RLEC and to output the information on the row path having the maximum number of the errors as the latched bank address LBADD and the latched row address LRADD.

The error log output circuit 817 may include inverters IV811, IV813, IV815, IV817, IV821, and IV823. The inverter IV811 may inversely buffer a first bit signal ELC<1> of the error log command ELC to output the inversely buffered signal of the first bit signal ELC<1> of the error log command ELC. The inverter IV813 may inversely buffer the latched error code LEC to output the inversely buffered signal of the latched error code LEC as the error log signal ELOG when the first bit signal ELC<1> of the error log command ELC has a logic "high" level. The inverter IV815 may inversely buffer a second bit signal ELC<2> of the error log command ELC to output the inversely buffered signal of the second bit signal ELC<2> of the error log command ELC. The inverter IV817 may inversely buffer the row latch error code RLEC to output the inversely buffered signal of the row latch error code RLEC as the error log signal ELOG when the second bit signal ELC<2> of the error log command ELC has a logic "high" level. The inverter IV821 may inversely buffer the latched bank address LBADD to output the inversely buffered signal of the latched bank address LBADD as the error log bank address ELBADD when the second bit signal ELC<2> of the error log command ELC has a logic "high" level. The inverter IV823 may inversely buffer the latched row address LRADD to output the inversely buffered signal of the latched row address LRADD as the error log row address ELRADD when the second bit signal ELC<2> of the error log command ELC has a logic "high" level.

Figure 14:
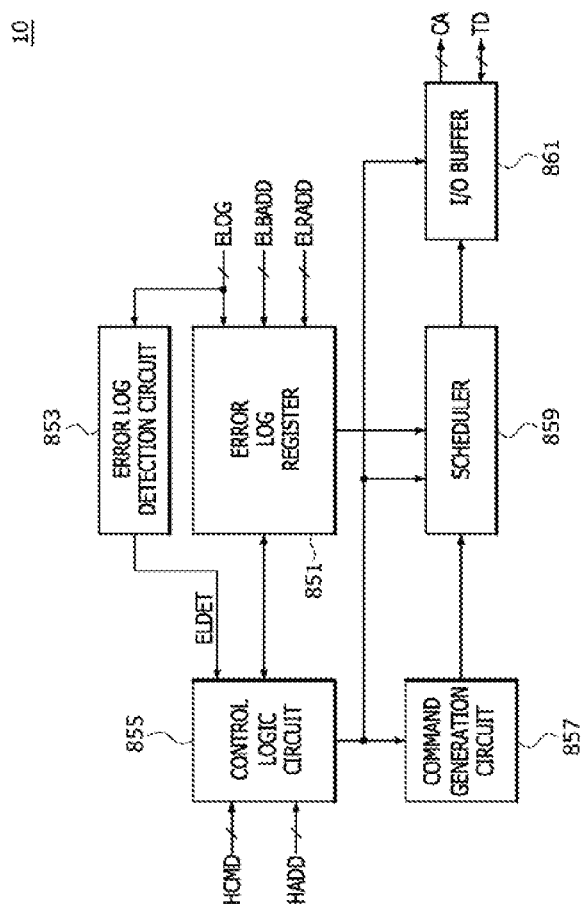
FIG. 14 is a block diagram, illustrating an example of a controller, included in the semiconductor system of FIG. 1.

FIG. 14 is a block diagram illustrating a configuration of the controller 10 included in the semiconductor system 1 of FIG. 1. As illustrated in FIG. 14, the controller 10 may include an error log register 851, an error log detection circuit 853, a control logic circuit 855, a command generation circuit 857, a scheduler 859, and an I/O buffer 861.

The error log register 851 may store the error log signal ELOG, the error log bank address ELBADD, and the error log row address ELRADD which are outputted from the semiconductor device 20.

The error log detection circuit 853 may generate an error log detection signal ELDET based on the error log signal ELOG. The error log detection circuit 853 may generate the error log detection signal ELDET which is activated when the number of memory cells storing an erroneous codeword verified by the error log signal ELOG is equal to or greater than a predetermined error limitation value. The predetermined error limitation value may be set to be different according to the embodiments.

The control logic circuit 855 may control the command generation circuit 857, the scheduler 859, and the I/O buffer 861 based on a host command HCMD and a host address HADD outputted from a host (1100 of FIG. 16) to perform the refresh operation, the active operation, the read operation, the write operation, or the ECS operation of the semiconductor device 20.

When the error log detection signal ELDET is activated, the control logic circuit 855 may control the command generation circuit 857, the scheduler 859, and the I/O buffer 861 such that the internal operations for the memory cells included in a row path selected by the error log bank address ELBADD and the error log row address ELRADD are not performed in the semiconductor device 20.

The I/O buffer 861 may transmit the command/address signal CA and the transmission data TD to the semiconductor device 20 during the write operation. The I/O buffer 861 may receive the transmission data TD from the semiconductor device 20 during the read operation.

Figure 15:
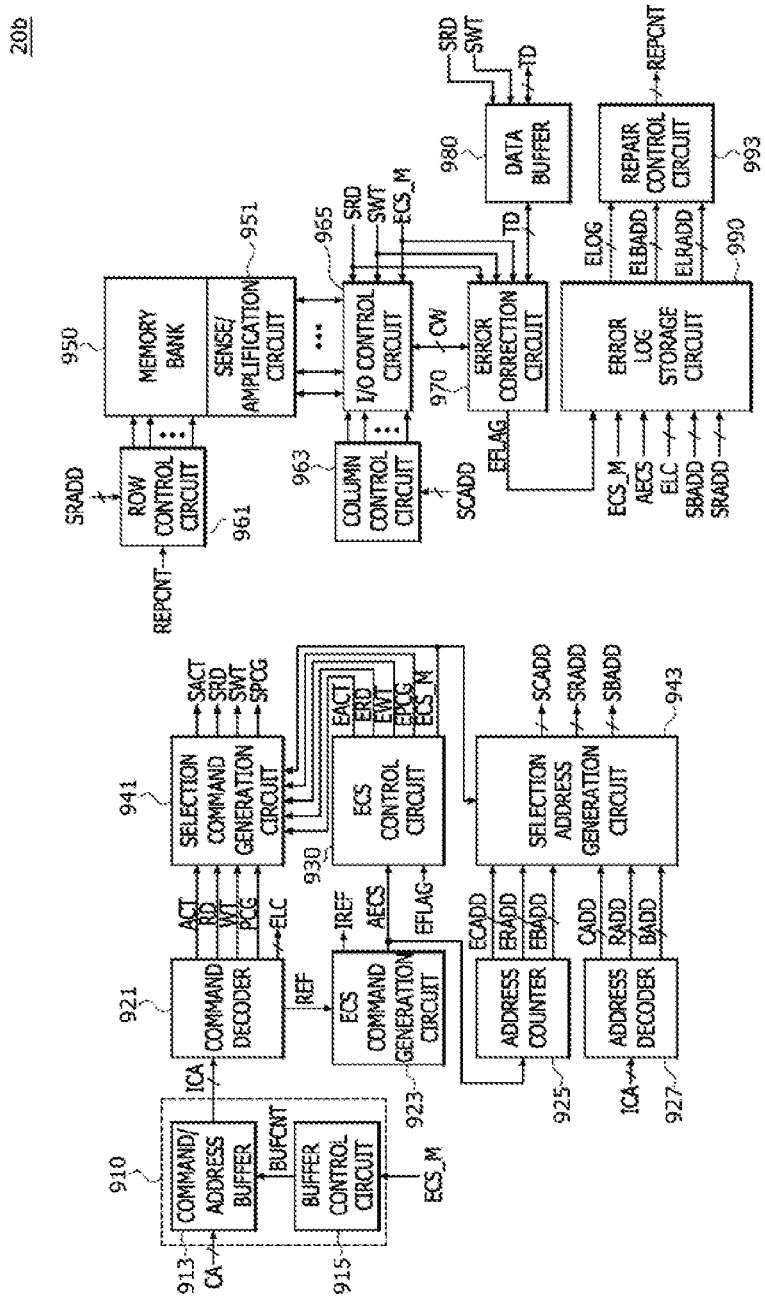
FIG. 15 is a block diagram, illustrating another example of a semiconductor device, included in the semiconductor system of FIG. 1.

FIG. 15 is a block diagram illustrating a configuration of a semiconductor device 20*b* corresponding to another example of the semiconductor device 20 included in the semiconductor system 1 of FIG. 1. As illustrated in FIG. 15, the semiconductor device 20*b* may include a command/address receiving circuit 910, a command decoder 921, an ECS command generation circuit 923, an address counter 925, an address decoder 927, the ECS control circuit 930, a selection command generation circuit 941, a selection address generation circuit 943, the memory bank 950, a sense/amplification circuit 951, a row control circuit 961, a column control circuit 963, an I/O control circuit 965, an error correction circuit 970, a data buffer 980, an error log storage circuit 990, and a repair control circuit 993.

The command/address receiving circuit 910 may include a command/address buffer 913 and a buffer control circuit 915. The command/address buffer 913 may buffer a command/address signal CA received through the first transmission line (L11 of FIG. 1) to generate an internal command/address signal ICA. The buffer control circuit 915 may generate a buffer control signal BUFCNT based on an ECS mode signal ECS_M when an ECS operation is performed. The command/address buffer 913 may receive the buffer control signal BUFCNT generated by the buffer control circuit 915 and may buffer the command/address signal CA to stop an operation for generating the internal command/address signal ICA when the ECS operation is performed.

The command decoder 921 may decode the internal command/address signal ICA to generate a refresh command REF, an active command ACT, a read command RD, a write command WT, a pre-charge command PCG, and an error log command ELC.

The ECS command generation circuit 923 may generate an ECS command AECS and an internal refresh command IREF based on the refresh command REF. The ECS command generation circuit 923 may generate the ECS command AECS whenever the refresh command REF is generated by the number of times corresponding to a predetermined set value. The ECS command generation circuit 923 may generate the internal refresh command IREF based on the refresh command REF when the ECS command AECS is not generated.

The address counter 925 may generate an ECS column address ECADD, an ECS row address ERADD, and an ECS bank address EBADD based on the ECS command AECS. The address counter 925 may count the ECS command AECS to sequentially increase a binary number corresponding to a logic level combination of bits included in the ECS column address ECADD, to sequentially increase a binary number corresponding to a logic level combination of bits included in the ECS row address ERADD, and to sequentially increase a binary number corresponding to a logic level combination of bits included in the ECS bank address EBADD.

The address decoder 927 may decode the internal command/address signal ICA to generate a column address CADD, a row address RADD, and a bank address BADD. The address decoder 927 may decode the internal command/address signal ICA to generate the column address CADD, the row address RADD, and the bank address BADD used for the internal operations including the active operation, the read operation, and the write operation.

The ECS control circuit 930 may generate the ECS mode signal ECS_M based on the ECS command AECS. The ECS mode signal ECS_M may be generated during a period that the ECS operation is performed. The ECS control circuit 930 may generate an ECS active command EACT, an ECS read command ERD, an ECS write command EWT, an ECS pre-charge command EPCG, and an ECS end command (ECS_END of FIG. 5) while the ECS operation is performed. The ECS control circuit 930 may count an internal clock signal (ICLK of FIG. 5) based on the error flag EFLAG to sequentially generate the ECS active command EACT, the ECS read command ERD, the ECS write command EWT, the ECS pre-charge command EPCG, and the ECS end command ECS_END while the ECS operation is performed. When no error detects from a codeword outputted from the memory cells during an ECS error correction operation not to generate the error flag EFLAG, the ECS control circuit 930 does not generate the ECS write command EWT.

The selection command generation circuit 941 may select and output the ECS active command EACT, the ECS read command ERD, the ECS write command EWT, and the ECS pre-charge command EPCG as a selection active command SACT, a selection read command SRD, a selection write command SWT, and a selection pre-charge command SPCG while the ECS operation is performed. The selection command generation circuit 941 may select and output the active command ACT, the read command RD, the write command WT, and the pre-charge command PCG as the selection active command SACT, the selection read command SRD, the selection write command SWT, and the selection pre-charge command SPCG while the ECS operation is not performed.

The selection address generation circuit 943 may select and output the ECS column address ECADD, the ECS row address ERADD, and the ECS bank address EBADD as a selection column address SCADD, a selection row address SRADD, and a selection bank address SBADD while the ECS operation is performed. The selection address generation circuit 943 may select and output the column address CADD, the row address RADD, and the bank address BADD as the selection column address SCADD, the selection row address SRADD, and the selection bank address SBADD while the ECS operation is not performed.

The memory bank 950 may include a plurality of memory cells, and each of the memory cells may be coupled to any one of word lines and any one of bit lines. One of the word lines connected to the memory cells included in the memory bank 950 may be selected by the selection row address SRADD. At least one of the bit lines connected to the memory cells included in the memory bank 950 may be selected by the selection column address SCADD. At least one of the memory cells may be accessed by selecting one of the word lines and at least one of the bit lines.

The sense/amplification circuit 951 may include a plurality of sense amplifiers (not shown). The sense amplifiers included in the sense/amplification circuit 951 may be connected to the memory cells included in the memory bank 950 and may sense and amplify levels of data signals loaded on the bit lines.

The row control circuit 961 may select one of the word lines coupled to the memory cells included in the memory bank 250 as a row path based on the selection row address SRADD. The row control circuit 961 may perform the active operation for loading a codeword stored in the memory cells connected to a word line selected by the selection row address SRADD on the bit lines such that the sense/amplification circuit 951 senses and amplifies data signals of the codeword. The row control circuit 961 may perform a repair operation for a row path having the maximum number of errors based on a repair control signal REPCNT. The row control circuit 961 may perform the repair operation using a way that replaces the row path having the maximum number of errors with a row path connected to redundant memory cells. Because a probability that most of memory cells connected to the row path having the maximum number of errors are failed memory cells is very high, the row control circuit 961 may replace the row path having the maximum number of errors with a row path connected to redundant memory cells using a row repair operation.

The column control circuit 963 may control the I/O control circuit 965 such that the codeword is inputted to or outputted from the sense amplifiers selected by the selection column address SCADD among the plurality of sense amplifiers coupled to the memory cells in a row path selected by the selection row address SRADD. The column control circuit 963 may control the I/O control circuit 965 such that the read operation and the write operation are performed for the memory cells coupled to the sense amplifiers selected by the selection column address SCADD among the plurality of memory cells included in a memory bank performing the active operation. In some other embodiments, the column control circuit 963 may be realized to perform a column repair operation which is executed using a way that replaces a column path connected to a failed memory cell with a redundant column path connected to a redundant memory cell based on the repair control signal REPCNT.

The I/O control circuit 965 may be coupled between the sense/amplification circuit 951 and the error correction circuit 970 to control input or output of a codeword based on the selection read command SRD, the selection write command SWT, and the ECS mode signal ECS_M. The I/O control circuit 965 may output a codeword CW including data and a parity outputted from the memory bank 950 to the error correction circuit 970 during the read operation or the ECS read operation. The I/O control circuit 965 may output the codeword CW received from the error correction circuit 970 to the memory bank 950 during the write operation or the ECS write operation.

The error correction circuit 970 may receive the codeword CW from the I/O control circuit 965 or may output the codeword CW to the I/O control circuit 965 based on the selection read command SRD, the selection write command SWT, and the ECS mode signal ECS_M. The error correction circuit 970 may receive the transmission data TD from the data buffer 980 or may output the transmission data TD to the data buffer 980 based on the selection read command SRD, the selection write command SWT, and the ECS mode signal ECS_M. The error correction circuit 970 may generate the error flag EFLAG based on the codeword CW. When the read operation is performed, the error correction circuit 970 may receive the codeword CW from the I/O control circuit 965 and may decode the codeword CW to generate the error flag EFLAG and to output data included in the codeword CW corrected by the error correction circuit 970 as the transmission data TD through the data buffer 980 if an error is detected from the codeword CW. When the write operation is performed, the error correction circuit 970 may encode the transmission data TD received from the data buffer 980 to generate the codeword CW including data and a parity and may transmit the codeword CW to the I/O control circuit 965 to store the codeword CW into the memory bank 950. When the ECS read operation is performed, the error correction circuit 970 may receive the codeword CW from the I/O control circuit 965 and may decode the codeword CW to generate the error flag EFLAG and the codeword CW corrected by the error correction circuit 970 if an error is detected from the codeword CW. The error correction circuit 970 may generate the corrected codeword CW during the ECS read operation, and the error correction circuit 970 may transmit the corrected codeword CW to the I/O control circuit 965 to store the corrected codeword CW into the memory bank 950 during the ECS write operation.

The data buffer 980 may receive the transmission data TD from the error correction circuit 970 or may output the transmission data TD to the error correction circuit 970 based on the selection read command SRD and the selection write command SWT. The data buffer 980 may receive the transmission data TD from the controller (10 of FIG. 1) or may output the transmission data TD to the controller (10 of FIG. 1) based on the selection read command SRD and the selection write command SWT. When the writ operation is performed, the data buffer 980 may transmit the transmission data TD received through the second transmission line (L13 of FIG. 1) to the error correction circuit 970. When the read operation is performed, the data buffer 980 may transmit the transmission data TD received from the error correction circuit 970 to the controller 10 through the second transmission line L13.

The error log storage circuit 990 may generate an error log signal ELOG, an error log row address ELRADD, and an error log bank address ELBADD based on the error flag EFLAG, the ECS mode signal ECS_M, the ECS command AECS, the error log command ELC, the selection row address SRADD, and the selection bank address SBADD. The error log storage circuit 990 may output information on the number of errors detected based on the error flag EFLAG as the error log signal ELOG when the ECS operations are performed for all of the memory cells included in the memory bank 950. When the ECS operations are performed for all of the memory cells included in the memory bank 950, the error log storage circuit 990 may compare the numbers of the errors of all of the row paths with each other based on the error flag EFLAG, the selection row address SRADD, and the selection bank address SBADD to output information on the maximum number of the errors as the error log signal ELOG and to output information on the row path having the maximum number of the errors as the error log row address ELRADD and the error log bank address ELBADD. The error log storage circuit 990 may transmit the error log signal ELOG to the controller 10 through the second transmission line L13. The error log storage circuit 990 may transmit the error log row address ELRADD and the error log bank address ELBADD to the controller 10 through the third transmission line L15.

The repair control circuit 993 may receive the error log signal ELOG, the error log row address ELRADD, and the error log bank address ELBADD to generate the repair control signal REPCNT for executing the repair operation for a row path having the maximum number of errors. The repair control signal REPCNT may include information (e.g., the error log row address ELRADD and the error log bank address ELBADD) on a row path necessitating the repair operation.

According to the embodiments, an ECS operation may be performed based on a refresh command. Thus, the ECS operation for correcting an error of a codeword stored in memory cells to restore the corrected codeword into the memory cells may be performed without using any other command provided by an external device.

In addition, according to the embodiments, reception of a command and an address is interrupted during the ECS operation. Thus, it may be possible to reduce power consumption of a command/address receiving circuit during the ECS operation and to prevent malfunction due to a command/address signal from occurring during the ECS operation.

Moreover, according to the embodiments, commands for the ECS operation may be generated using an internal clock signal or an external clock signal. Thus, the ECS operation may be performed at a constant speed regardless of variation of a data rate.

Furthermore, according to the embodiments, a repair operation may be performed based on information on the maximum number of errors detected from a row path and information on a row path having the maximum number of errors. Thus, the repair operation for a row path having a lot of failed memory cells may be more readily performed.

Figure 16:
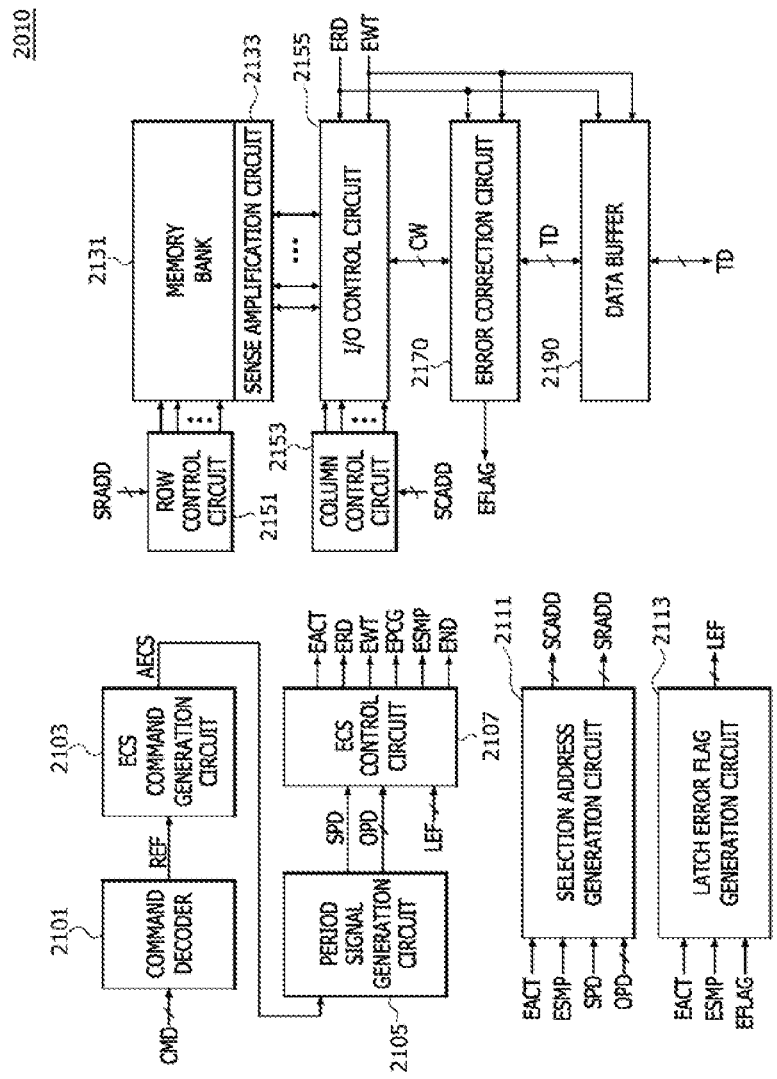
FIG. 16 is a block diagram, illustrating yet another example of a semiconductor device, included in the semiconductor system illustrated in FIG. 1.

FIG. 16 is a block diagram, illustrating a configuration of a semiconductor device 2010, corresponding to yet another example of the semiconductor device 20, included in the semiconductor system 1 of FIG. 1. The semiconductor device 2010 may include a command decoder 2101, an ECS command generation circuit 2103, a period signal generation circuit 2105, an ECS control circuit 2107, a selection address generation circuit 2111, a latch error flag generation circuit 2113, a memory bank 2131, a sense/amplification circuit 2133, a row control circuit 2151, a column control circuit 2153, an I/O control circuit 2155, an error correction circuit 2170, and a data buffer 2190.

The command decoder 2101 may decode a command CMD to generate a refresh command REF. The refresh command REF may be generated to perform a refresh operation. The command CMD may include a plurality of bits with a logic level combination to generate the refresh command REF.

The ECS command generation circuit 2103 may generate an ECS command AECS based on the refresh command REF. The ECS command generation circuit 2103 may generate the ECS command AECS whenever the refresh command REF is generated a certain number of times, corresponding to a predetermined set value. For example, if the predetermined set value is a natural number 'K', which is equal to or more than two, the ECS command generation circuit 2103 may generate the ECS command AECS when the refresh command REF is generated 'K' times.

The period signal generation circuit 2105 may sequentially generate a sampling period signal SPD and an operation period signal OPD based on the ECS command AECS. The sampling period signal SPD may be generated during a sampling period in which a latch error flag LEF, including information on whether errors exist in codewords that are stored in memory cells for which an ECS operation is performed, is generated. Each of the codewords may include data and a parity. The parity may be generated from the data by using an error correction code (ECC). During the sampling period, ECS read operations may be performed a certain number of times based on the number of codewords that are stored in the memory cells for which the ECS operations are performed, and the latch error flag LEF may be generated for each codeword. The number of bits that are included in the latch error flag LEF may be set to be equal to the number of codewords that is stored in the memory cells for which the ECS operations are performed. The operation period signal OPD may be generated for each of operation periods such that the ECS operation is performed for each of the codewords, stored in the memory cells, selected during the sampling period. The number of bits that are included in the operation period signal OPD may be set to be equal to the number of the codewords that are stored in the memory cells for which the ECS operations are performed. The ECS operation may include an ECS read operation, an ECS error correction operation, and an ECS write operation. When the ECS operation is performed, errors of the codewords that are stored in the selected memory cells may be corrected, and the corrected codewords may be stored into the memory cells again.

The ECS control circuit 2107 may generate an ECS active command EACT, an ECS read command ERD, an ECS write command EWT, an ECS pre-charge command EPCG, a sampling command ESMP, and an end signal END based on the sampling period signal SPD, the operation period signal OPD, and the latch error flag LEF. The ECS active command EACT may be generated to perform an ECS active operation. The ECS read command ERD may be generated to perform an ECS read operation. The ECS write command EWT may be generated to perform an ECS write operation. The ECS pre-charge command EPCG may be generated to perform a pre-charge operation of memory cells for which the ECS operation is performed. The sampling command ESMP may be generated to generate the latch error flag LEF with information on whether errors exist in codewords that are stored in memory cells for which the ECS operation is performed during the sampling period. The end signal END may be generated to terminate the sampling period and the operation period.

The ECS control circuit 2107 may generate the ECS read command ERD and the sampling command ESMP for each of the codewords that is stored in the memory cells for which the ECS operation is performed after generation of the ECS active command EACT and may generate the end signal END, to determine whether errors exist in the codewords stored in the memory cells for which the ECS operation is performed, during the sampling period in which the sampling period signal SPD is generated. The ECS control circuit 2107 may sequentially generate the ECS active command EACT, the ECS read command ERD, the ECS write command EWT, the ECS pre-charge command EPCG, and the end signal END such that the ECS operations for the memory cells, storing the codewords with errors, are performed based on the latch error flag LEF during the operation period in which the operation period signal OPD is generated. According to the present embodiment, the semiconductor device 2010 may operate such that the ECS operation is selectively performed for only memory cells that store the codewords with errors. Thus, it may be possible to reduce the power consumption of the semiconductor device 2010.

The selection address generation circuit 2111 may generate a selection column address SCADD and a selection row address SRADD based on the ECS active command EACT, the sampling command ESMP, the sampling period signal SPD, and the operation period signal OPD. An output signal of the selection address generation circuit 2111 may change to provide one of the selection column address SCADD and the selection row address SRADD to access memory cells for which the ECS operation is performed whenever the ECS active command EACT and the sampling command ESMP are generated during the sampling period in which the sampling period signal SPD is generated. The selection address generation circuit 2111 may sequentially output addresses that are stored during the sampling period as the selection column address SCADD and the selection row address SRADD, in order to sequentially perform the ECS operations for memory cells that store the codewords with errors, during the operation period in which the operation period signal OPD is generated.

The latch error flag generation circuit 2113 may generate the latch error flag LEF based on the ECS active command EACT, the sampling command ESMP, and an error flag EFLAG. The latch error flag generation circuit 2113 may generate the latch error flag LEF by latching the error flag EFLAG with information on whether an error exists in the codeword that is stored in memory cells that are selected whenever the ECS active command EACT and the sampling command ESMP are generated during the sampling period. The latch error flag generation circuit 2113 may generate the latch error flag LEF by latching the error flag EFLAG for each of all of memory cells for which the ECS operations are performed during the sampling period. The number of bits that are included in the latch error flag LEF may be set to be equal to the number of codewords that are stored in the memory cells for which the ECS operations are performed.

The memory bank 2131 may include a plurality of memory cells, and each of the memory cells may be coupled to one of word lines and one of bit lines. One of the word lines that is coupled to the memory cells in the memory bank 2131, may be selected by the selection row address SRADD. At least one of the bit lines that is coupled to the memory cells in the memory bank 2131, may be selected by the selection column address SCADD. At least one of the memory cells in the memory bank 2131 may be accessed by selecting one of the word lines and at least one of the bit lines. The number of word lines that are coupled to the memory cells in the memory bank 2131, may be set to be different according to the embodiments. The number of the bit lines that are coupled to the memory cells in the memory bank 2131, may also be set to be different according to the embodiments. The codeword with data and a parity may be stored into some of the memory cells in the memory bank 2131.

The sense/amplification circuit 2133 may include a plurality of sense amplifiers (not shown). The sense amplifiers that are included in the sense/amplification circuit 2133 may be connected to the bit lines that are coupled to the memory cells in the memory bank 2131, and may sense and amplify the levels of data signals that are loaded on the bit lines.

The row control circuit 2151 may select one of the word lines that is coupled to the memory cells in the memory bank 2131, as a row path based on the selection row address SRADD. The row control circuit 2151 may perform the ECS active operation to load data and parities that are stored in the memory cells in a row path, selected by the selection row address SRADD, on the bit lines such that the sense/amplification circuit 2133 senses and amplifies the levels of the data and the parities.

The column control circuit 2153 may control the I/O control circuit 2155 such that the data are inputted to or outputted from the sense amplifiers that are selected by the selection column address SCADD among the plurality of sense amplifiers coupled to the memory cells connected to the row path. The column control circuit 2153 may control the I/O control circuit 2155 such that the ECS read operation and the ECS write operation are performed on the memory cells that are coupled to the sense amplifiers, selected by the selection column address SCADD, among the plurality of memory cells in the memory bank 2131 that perform the active operation.

The I/O control circuit 2155 may be coupled between the sense/amplification circuit 2133 and the error correction circuit 2170 to control the input or output of data based on the ECS read command ERD and the ECS write command EWT. The I/O control circuit 2155 may output a codeword CW that is outputted from the memory bank 2131 to the error correction circuit 2170 during the ECS read operation. The I/O control circuit 2155 may output the codeword CW that is received from the error correction circuit 2170 to the memory bank 2131 during the ECS write operation. The codeword CW that is outputted from the error correction circuit 2170 may include corrected data and a parity.

The error correction circuit 2170 may receive the codeword CW from the I/O control circuit 2155 or may output the codeword CW to the I/O control circuit 2155 based on the ECS read command ERD and the ECS write command EWT. The error correction circuit 2170 may receive the transmission data TD from the data buffer 2190 or may output the transmission data TD to the data buffer 2190 based on the ECS read command ERD and the ECS write command EWT. The error correction circuit 2170 may generate the error flag EFLAG based on the codeword CW. While the ECS read operation is performed, the error correction circuit 2170 may receive the codeword CW from the I/O control circuit 2155 and may decode the codeword CW to generate the error flag EFLAG when an error exists in the codeword CW. The error correction circuit 2170 may perform the error correction operation to generate a corrected codeword. The error correction circuit 2170 may generate the corrected codeword through the ECS read operation and the error correction operation and may transmit the corrected codeword to the I/O control circuit 2155 to store the corrected codeword into the memory bank 2131 during the ECS write operation. The error correction circuit 2170 may correct an error that is included in the codeword CW by using an error correction code (ECC).

The data buffer 2190 may receive the transmission data TD from the error correction circuit 2170 or may output the transmission data TD to the error correction circuit 2170 based on the ECS read command ERD and the ECS write command EWT. The data buffer 2190 may receive the transmission data TD from the controller (10 of FIG. 1) or may output the transmission data TD to the controller (10 of FIG. 1) based on the ECS read command ERD and the ECS write command EWT.

Figure 17:
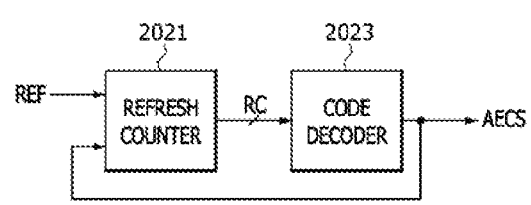
FIG. 17 is a block diagram, illustrating an example of an ECS command generation circuit, included in the semiconductor device illustrated in FIG. 16.

FIG. 17 is a block diagram, illustrating an example of an ECS command generation circuit 2103, included in the semiconductor device 2010 illustrated in FIG. 16. As illustrated in FIG. 17, the ECS command generation circuit 2103 may include a refresh counter 2021 and a code decoder 2023.

The refresh counter 2021 may count the refresh command REF to generate a refresh code RC. The refresh counter 2021 may change the logic level combination of bits that are included in the refresh code RC whenever the refresh command REF is inputted to the refresh counter 2021. For example, when the refresh code RC is set to have two bits, the refresh code RC may change to have the logic level combination of '00', '01', '10', and '11' in sequence whenever the refresh command REF is inputted to the refresh counter 2021. In the refresh code RC, the logic level combination of '01' means that a second bit of the refresh code RC has a logic "low(0)" level and a first bit of the refresh code RC has a logic "high(1)" level. The number of bits that are included in the refresh code RC may be set to be different according to the embodiments.

The code decoder 2023 may generate the ECS command AECS based on the refresh code RC. The code decoder 2023 may generate the ECS command AECS when the refresh code RC has a predetermined logic level combination. For example, the code decoder 2023 may generate the ECS command AECS when the refresh command REF is generated a third time so that the refresh code RC<2:1> has the logic level combination of '10'.

Figure 18:
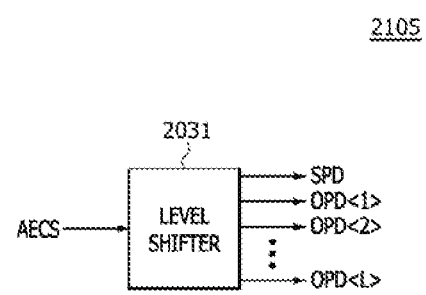
FIG. 18 is a block diagram, illustrating an example of a period signal generation circuit, included in the semiconductor device illustrated in FIG. 16.

FIG. 18 is a block diagram, illustrating a configuration of the period signal generation circuit 2105. As illustrated in FIG. 18, the period signal generation circuit 2105 may include a level shifter 2031. The level shifter 2031 may generate the sampling period signal SPD when the ECS command AECS is generated a first time and may sequentially shift a logic level of the operation period signal OPD to generate a first bit signal OPD<1> of the operation period signal OPD, a second bit signal OPD<2> of the operation period signal OPD, . . . , and an $L^{th}$ bit signal OPD<L> of the operation period signal OPD, in order, whenever the ECS command AECS is successively generated. The sampling period signal SPD may be generated during the sampling period in which the latch error flag LEF with information on whether the codewords CW, stored in the memory cells for which the ECS operation is performed, include an error, is generated. The number of the memory cells for which the ECS operation is performed and the number of bits within the latch error flag LEF may be set to be 'L', which is a natural number that is equal to or greater than '3'. The operation period signal OPD may be generated during each operation period that the ECS operation is performed for each of the codewords that are stored in the memory cells in order to perform the ECS operation for the memory cells that are selected during the sampling period.

Figure 19:
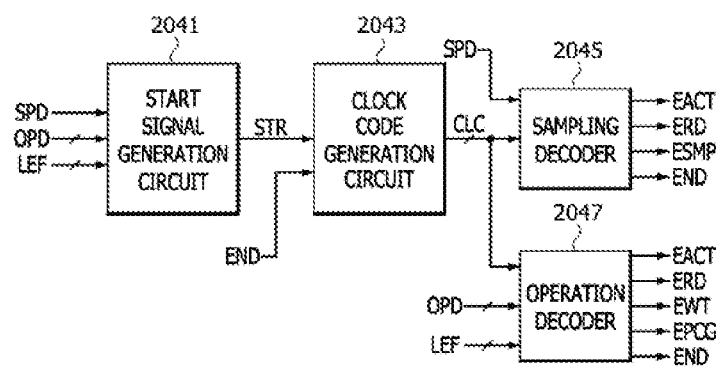
FIG. 19 is a block diagram, illustrating an example of an ECS control circuit, included in the semiconductor device illustrated in FIG. 16.

FIG. 19 is a block diagram, illustrating a configuration of the ECS control circuit 2107. As illustrated in FIG. 19, the ECS control circuit 2107 may include a start signal generation circuit 2041, a clock code generation circuit 2043, a sampling decoder 2045, and an operation decoder 2047.

The start signal generation circuit 2041 may generate a start signal STR based on the sampling period signal SPD, the operation period signal OPD, and the latch error flag LEF. The start signal generation circuit 2041 may generate the start signal STR when the sampling period signal SPD is generated. The start signal generation circuit 2041 may generate the start signal STR when the operation period signal OPD and the latch error flag LEF are generated.

The clock code generation circuit 2043 may generate a clock code CLC based on the start signal STR and the end signal END. The clock code generation circuit 2043 may generate the clock code CLC, a logic level combination of which is adjusted in synchronization with the period signal (OSC of FIG. 5) that is generated during a period from a point in time when the start signal STR is generated until a point in time when the end signal END is generated.

The sampling decoder 2045 may generate the ECS active command EACT, the ECS read command ERD, the sampling command ESMP, and the end signal END based on the sampling period signal SPD and the clock code CLC. When the sampling period signal SPD is generated, the sampling decoder 2045 may sequentially generate the ECS active command EACT, the ECS read command ERD, the sampling command ESMP, and the end signal END in synchronization with the clock code CLC. The sampling decoder 2045 may generate the ECS read command ERD and the sampling command ESMP for each of the codewords after the generation of the ECS active command EACT and may generate the end signal END, to determine whether errors exist in the codewords that are stored in the memory cells for which the ECS operation is performed, during the sampling period in which the sampling period signal SPD is generated.

The operation decoder 2047 may generate the ECS active command EACT, the ECS read command ERD, the ECS write command EWT, the ECS pre-charge command EPCG, and the end signal END based on the operation period signal OPD, the latch error flag LEF, and the clock code CLC. When the operation period signal OPD and the latch error flag LEF are generated, the operation decoder 2047 may sequentially generate the ECS active command EACT, the ECS read command ERD, the ECS write command EWT, the ECS pre-charge command EPCG, and the end signal END in synchronization with the clock code CLC. The operation decoder 2047 may sequentially generate the ECS active command EACT, the ECS read command ERD, the ECS write command EWT, the ECS pre-charge command EPCG, and the end signal END to perform the ECS operation for the memory cells storing the codewords CW including errors, based on the latch error flag LEF, during the operation period in which the operation period signal OPD is generate.

Figure 20:
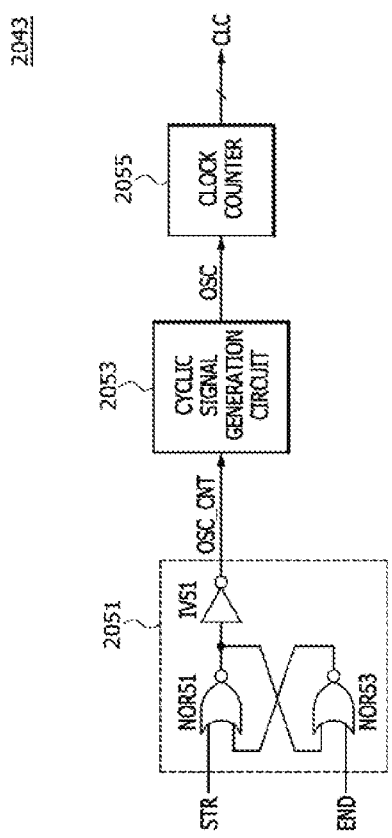
FIG. 20 illustrates an example of a clock code generation circuit included in the ECS control circuit illustrated in FIG. 19.

FIG. 20 illustrates a configuration of the clock code generation circuit 2043. As illustrated in FIG. 20, the clock code generation circuit 2043 may include an oscillation control signal generation circuit 2051, a periodic signal generation circuit 2053, and a clock counter 2055.

The oscillation control signal generation circuit 2051 may include NOR gates NOR51 and NOR53 and an inverter IV51. The NOR gate NOR51 may receive the start signal STR and an output signal of the NOR gate NOR53 to perform a logical NOR operation of the start signal STR and an output signal of the NOR gate NOR53. The NOR gate NOR53 may receive the end signal END and an output signal of the NOR gate NOR51 to perform a logical NOR operation of the end signal END and an output signal of the NOR gate NOR51. The inverter IV51 may inversely buffer an output signal of the NOR gate NOR51 to generate an oscillation control signal OSC_CNT. The oscillation control signal generation circuit 2051 may generate the oscillation control signal OSC_CNT with a logic "high" level during a period when the start signal STR is generated to have a logic "high" level until the end signal END is generated to have a logic "high" level.

The periodic signal generation circuit 2053 may generate a periodic signal OSC based on the oscillation control signal OSC_CNT. The periodic signal generation circuit 2053 may generate the periodic signal OSC that is toggled to have a predetermined cycle time whenever the oscillation control signal OSC_CNT is generated to have a logic "high" level.

The clock counter 2055 may generate the clock code CLC based on the periodic signal OSC. The clock counter 2055 may count the periodic signal OSC to adjust the logic level combination of the clock code CLC. For example, when the clock code CLC has three bits, the clock counter 2055 may be synchronized (hereinafter, referred to as 'a rising edge') when a logic level of the periodic signal OSC changes from a logic "low" level into a logic "high" level, sequentially increasing the logic level combination of the clock code CLC in order of '001', '010', '011', '100', '101', '110', and '111'. In the clock code CLC, the logic level combination of '110' means that third and second bit signals CLC<3:2> of the clock code CLC have a logic "high" level and a first bit signal CLC<1> of the clock code CLC has a logic "low" level.

Figure 21:
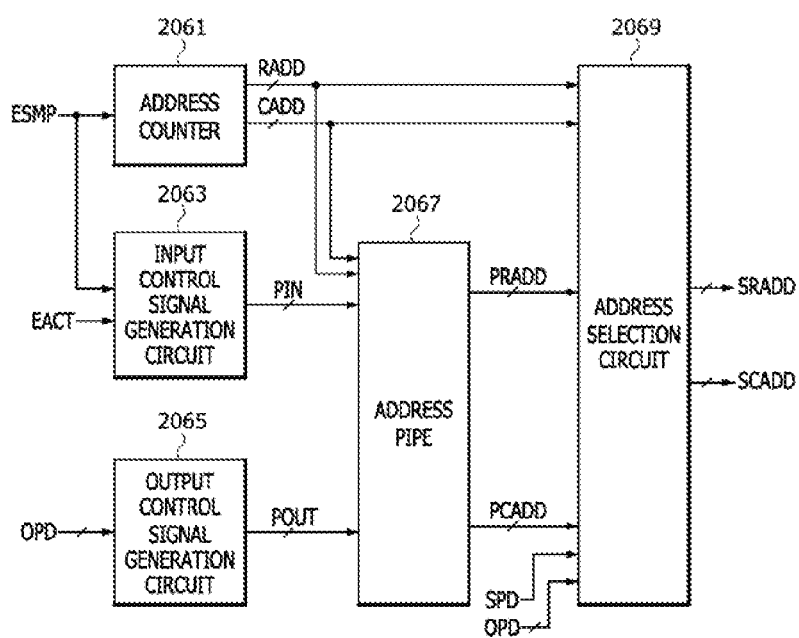
FIG. 21 is a block diagram, illustrating an example of a selection address generation circuit, included in the semiconductor device illustrated in FIG. 16.

FIG. 21 is a block diagram, illustrating a configuration of the selection address generation circuit 2111. As illustrated in FIG. 21, the selection address generation circuit 2111 may include an address counter 2061, an input control signal generation circuit 2063, an output control signal generation circuit 2065, an address pipe 2067, and an address selection circuit 2069.

The address counter 2061 may generate a row address RADD and a column address CADD based on the sampling command ESMP. The address counter 2061 may count the sampling command ESMP to adjust the logic level combination of the row address RADD and the column address CADD. The address counter 2061 may generate the row address RADD and the column address CADD, capable of accessing to other memory cells whenever the sampling command ESMP is generated.

The input control signal generation circuit 2063 may generate an input control signal PIN based on the ECS active command EACT and the sampling command ESMP. For example, the input control signal generation circuit 2063 may generate a first bit signal PIN<1> of the input control signal PIN based on the ECS active command EACT and may sequentially generate a second bit signal PIN<2>, a third bit signal PIN<3>, and a fourth bit signal PIN<4> of the input control signal PIN by changing an output signal of the input control signal generation circuit 2063 whenever the sampling command ESMP is generated. The number of bits included in the input control signal PIN may be set to be different according to the embodiments.

The output control signal generation circuit 2065 may generate an output control signal POUT based on the operation period signal OPD. For example, the output control signal generation circuit 2065 may generate a first bit signal POUT<1> of the output control signal POUT when the first bit signal OPD<1> of the operation period signal OPD is generated, may generate a second bit signal POUT<2> of the output control signal POUT when the second bit signal OPD<2> of the operation period signal OPD is generated, may generate a third bit signal POUT<3> of the output control signal POUT when the third bit signal OPD<3> of the operation period signal OPD is generated, and may generate a fourth bit signal POUT<4> of the output control signal POUT when the fourth bit signal OPD<3> of the operation period signal OPD is generated. The number of bits that are included in the operation period signal OPD and the number of bits that are included in the output control signal POUT may be set to be different according to the embodiments.

The address pipe 2067 may be stored in the row address RADD and the column address CADD based on the input control signal PIN, and the address pipe 2067 may output the stored row address RADD and the stored column address CADD as a pipe row address PRADD and a pipe column address PCADD based on the output control signal POUT. For example, the address pipe 2067 may store the row address RADD and the column address CADD when a $J^{th}$ bit signal PIN<J> of the input control signal PIN is generated and may output the stored row address RADD and the stored column address CADD as the pipe row address PRADD and the pipe column address PCADD when a $J^{th}$ bit signal POUT<J> of the output control signal POUT is generated. The number '3' of the $J^{th}$ bit signal PIN<J> and the $J^{th}$ bit signal POUT<J> may be set to be a natural number.

The address selection circuit 2069 may generate the selection row address SRADD and the selection column address SCADD from the row address RADD, the column address CADD, the pipe row address PRADD, and the pipe column address PCADD based on the sampling period signal SPD and the operation period signal OPD. The address selection circuit 2069 may select and output the row address RADD and the column address CADD as the selection row address SRADD and the selection column address SCADD during the sampling period in which the sampling period signal SPD is generated. The address selection circuit 2069 may select and output the pipe row address PRADD and the pipe column address PCADD as the selection row address SRADD and the selection column address SCADD during the operation period in which the operation period signal OPD is generated.

Figure 22:
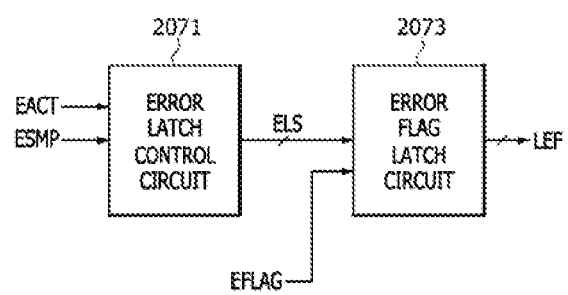
FIG. 22 is a block diagram, illustrating an example of a latch error flag generation circuit, included in the semiconductor device illustrated in FIG. 16.

FIG. 22 is a block diagram, illustrating a configuration of the latch error flag generation circuit 2113. As illustrated in FIG. 22, the latch error flag generation circuit 2113 may include an error latch control circuit 2071 and an error flag latch circuit 2073.

The error latch control circuit 2071 may generate an error latch signal ELS based on the ECS active command EACT and the sampling command ESMP. The error latch control circuit 2071 may sequentially generate bit signals of the error latch signal ELS by changing an output signal of the error latch control circuit 2071 whenever the ECS active command EACT and the sampling command ESMP are generated during the sampling period. For example, the error latch control circuit 2071 may generate a first bit signal ELS<1> of the error latch signal ELS when the ECS active command EACT is generated, may generate a second bit signal ELS<2> of the error latch signal ELS when the sampling command ESMP is generated a first time, and may generate a third bit signal ELS<3> of the error latch signal ELS when the sampling command ESMP is generated a second time.

The error flag latch circuit 2073 may generate the latch error flag LEF from the error flag EFLAG based on the error latch signal ELS. The error flag latch circuit 2073 may latch the error flag EFLAG for a plurality of memory cells to generate the latch error flag LEF. The error flag latch circuit 2073 may generate the latch error flag LEF by latching the error flag EFLAG with information on whether an error exists in the codeword CW that is stored in the accessed memory cells, based on the error latch signal ELS that is generated based on the ECS active command EACT and the sampling command ESMP during the sampling period.

Figure 23:
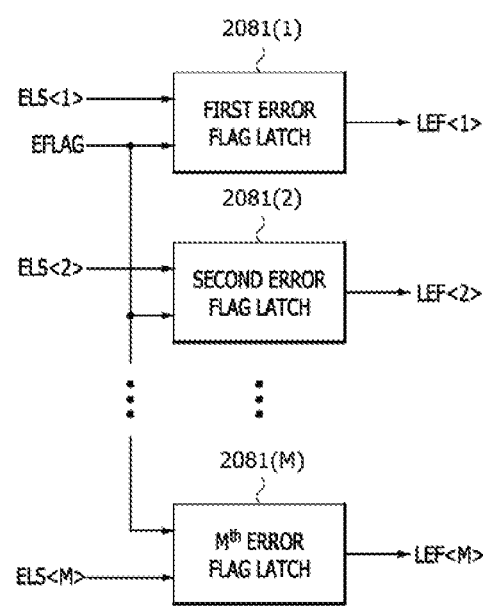
FIG. 23 is a block diagram, illustrating an example of an error flag latch circuit, included in the latch error flag generation circuit illustrated in FIG. 22.

FIG. 23 is a block diagram, illustrating a configuration of the error flag latch circuit 2073. As illustrated in FIG. 23, the error flag latch circuit 2073 may include a first error flag latch 2081(1), a second error flag latch 2081(2), and an $M^{th}$ error flag latch 2081(M).

When the first bit signal ELS<1> of the error latch signal ELS is generated, the first error flag latch 2081(1) may latch the error flag EFLAG with information on whether an error exists in a first memory cell (not shown) and may output the latched error flag EFLAG as a first bit signal LEF<1> of the latch error flag LEF.

When the second bit signal ELS<2> of the error latch signal ELS is generated, the second error flag latch 2081(2) may latch the error flag EFLAG with information on whether an error exists in a second memory cell (not shown) and may output the latched error flag EFLAG as a second bit signal LEF<2> of the latch error flag LEF.

When the $M^{th}$ bit signal ELS<M> of the error latch signal ELS is generated, the $M^{th}$ error flag latch 2081(M) may latch the error flag EFLAG with information on whether an error exists in an $M^{th}$ memory cell (not shown) and may output the latched error flag EFLAG as an $M^{th}$ bit signal LEF<M> of the latch error flag LEF. The number 'M' of the $M^{th}$ bit signal LEF<M> may be set to be a natural number.

FIGS. 24 to 27 are timing diagrams, illustrating operations of the semiconductor device 2010 illustrated in FIG. 16.

Figure 24:
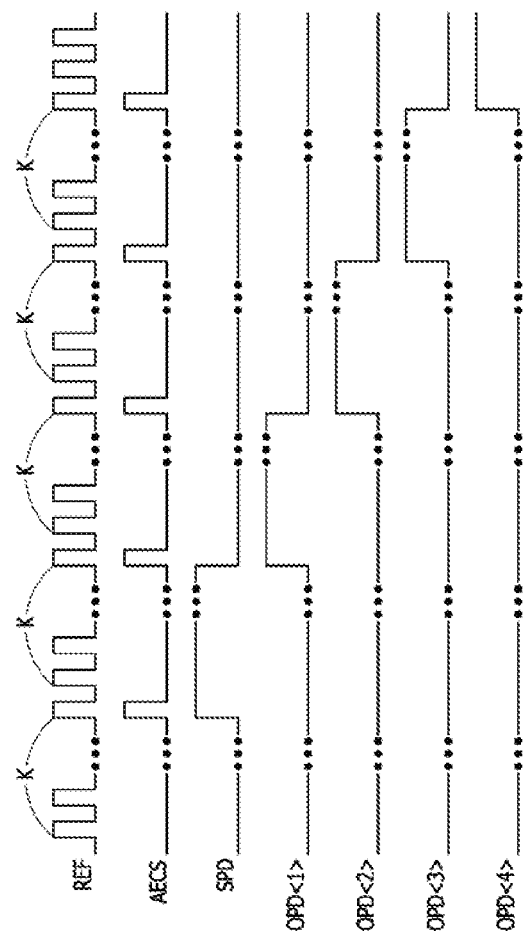
FIGS. 24 to 27 are timing diagrams, illustrating operations of the semiconductor device illustrated in FIG. 16.

As illustrated in FIG. 24, whenever the refresh command REF is generated a $K^{th}$ time, the ECS command AECS may be generated and the sampling period signal SPD and the operation period signal OPD may be sequentially generated according to the ECS command AECS. More specifically, the sampling period signal SPD may be generated when the ECS command AECS is generated a first time, the first bit signal OPD<1> of the operation period signal OPD may be generated when the ECS command AECS is generated a second time, the second bit signal OPD<2> of the operation period signal OPD may be generated when the ECS command AECS is generated a third time, the third bit signal OPD<3> of the operation period signal OPD may be generated when the ECS command AECS is generated a fourth time, and the fourth bit signal OPD<4> of the operation period signal OPD may be generated when the ECS command AECS is generated a fifth time.

Figure 25:
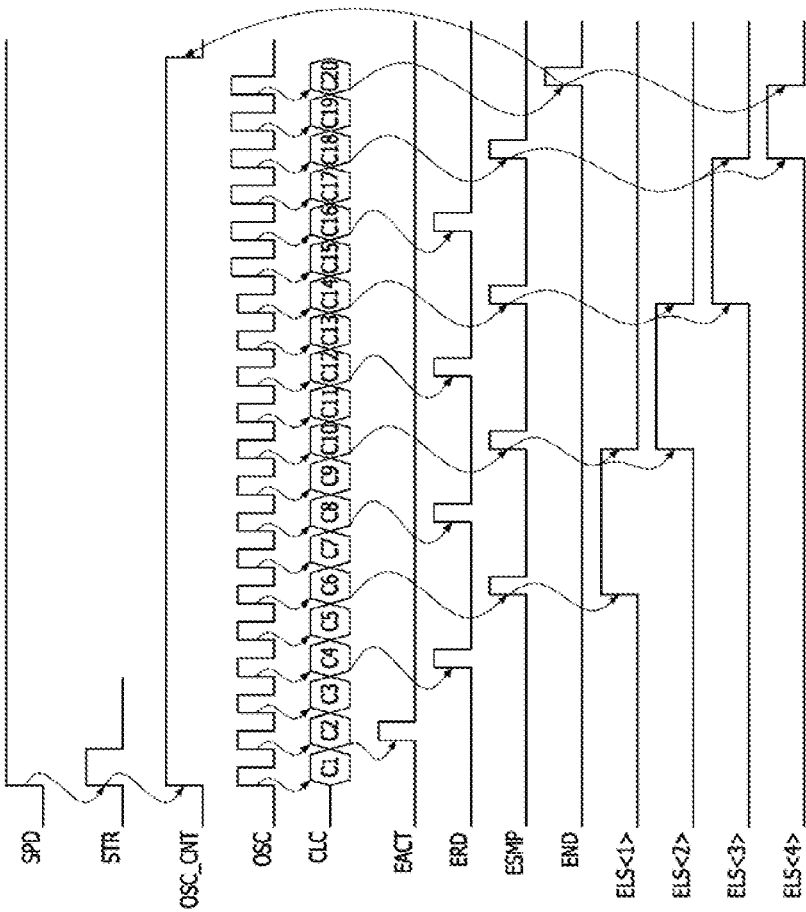

As illustrated in FIG. 25, in order to determine whether an error exists in each of the codewords stored in memory cells for which the ECS operation is performed during the sampling period in which the sampling period signal SPD is generated to have a logic "high" level, the ECS read command ERD and the sampling command ESMP for each of the codewords may be generated after the ECS active command EACT is generated, and the end signal END may be generated after the ECS read commands ERD and the sampling commands ESMP for all of the codewords are generated. Moreover, in order to generate the latch error flag LEF for the memory cells in which the codewords CW including errors are stored, the error latch signal ELS may be generated. Operations of the semiconductor device 2010, during the sampling period, will be described in more detail hereinafter.

When the level of the sampling period signal SPD transitions from a logic "low" level into a logic "high" level, the start signal STR may be generated. When the oscillation control signal OSC_CNT is generated by the start signal STR, the periodic signal OSC may be generated to be toggled. The logic level combination of the clock code CLC may change whenever a pulse of the periodic signal OSC is generated so that the clock code CLC sequentially has first to twentieth logic level combinations C1~S20. When the clock code CLC has the second logic level combination C2, the ECS active command EACT may be generated. Addresses with the row address RADD and the column address CADD for accessing to first memory cells (not shown) may be generated by the ECS active command EACT. If the ECS read command ERD is generated when the clock code CLC has the fourth logic level combination C4, the ECS read operation and the error correction operation for the first memory cells may be performed to generate the error flag EFLAG including information on whether an error exists in the codeword CW stored in the first memory cells. If the sampling command ESMP is generated a first time when the clock code CLC has the sixth logic level combination C6, the first bit signal ELS<1> of the error latch signal ELS may be generated to generate the first bit signal LEF<1> of the latch error flag LEF by latching the error flag EFLAG.

Addresses for accessing the second memory cells (not shown) may be generated by the sampling command ESMP which is generated a first time. If the ECS read command ERD is generated when the clock code CLC has the eighth logic level combination C8, the ECS read operation and the error correction operation for the second memory cells may be performed to generate the error flag EFLAG with information on whether an error exists in the codeword CW that is stored in the second memory cells. If the sampling command ESMP is generated a second time when the clock code CLC has the tenth logic level combination C10, the second bit signal ELS<2> of the error latch signal ELS may be generated to generate the second bit signal LEF<2> of the latch error flag LEF by latching the error flag EFLAG.

Addresses for accessing the third memory cells (not shown) may be generated by the sampling command ESMP which is generated a second time. If the ECS read command ERD is generated when the clock code CLC has the twelfth logic level combination C12, the ECS read operation and the error correction operation for the third memory cells may be performed to generate the error flag EFLAG with information on whether an error exists in the codeword CW that is stored in the third memory cells. If the sampling command ESMP is generated a third time when the clock code CLC has the fourteenth logic level combination C14, the third bit signal ELS<3> of the error latch signal ELS may be generated to generate the third bit signal LEF<3> of the latch error flag LEF by latching the error flag EFLAG.

Addresses for accessing the fourth memory cells (not shown) may be generated by the sampling command ESMP which is generated a third time. If the ECS read command ERD is generated when the clock code CLC has the sixteenth logic level combination C16, the ECS read operation and the error correction operation for the fourth memory cells may be performed to generate the error flag EFLAG with information on whether an error exists in the codeword CW that is stored in the fourth memory cells. If the sampling command ESMP is generated a fourth time when the clock code CLC has the eighteenth logic level combination C18, the fourth bit signal ELS<4> of the error latch signal ELS may be generated to generate the fourth bit signal LEF<4> of the latch error flag LEF by latching the error flag EFLAG.

If the end signal END is generated when the clock code CLC has the twentieth logic level combination C20, the logic level of the oscillation control signal OSC_CNT may change from a logic "high" level into a logic "low" level to terminate generation of the periodic signal OSC. If the end signal END is generated, all of the bit signals of the error latch signal ELS might not be generated.

Figure 26:
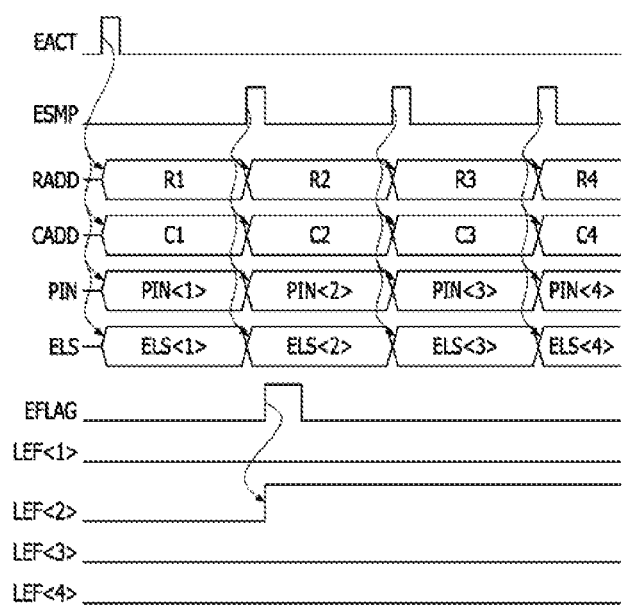

Referring to FIG. 26, the error flag EFLAG for the first to fourth memory cells may be generated during the sampling period and the latch error flag LEF may be generated when the error flag EFLAG is generated. An operation for generating the latch error flag LEF during the sampling period will be described in detail hereinafter.

When the ECS active command EACT is generated, a first row address R1 and a first column address C1 may be generated to access the first memory cells (not shown) and a first bit signal PIN<1> of the input control signal PIN may be generated to have a logic "high" level to store the first row address R1 and the first column address C1. When the ECS active command EACT is generated, the first bit signal ELS<1> of the error latch signal ELS may be generated to latch the error flag EFLAG with information on whether an error exists in the codeword CW that is stored in the first memory cells and to output the latched error flag EFLAG as the first bit signal LEF<1> of the latch error flag LEF. When the first bit signal ELS<1> of the error latch signal ELS is generated, the first bit signal LEF<1> of the latch error flag LEF is not generated because the error flag EFLAG is not generated.

When the sampling command ESMP is generated a first time, a second row address R2 and a second column address C2 may be generated to access the second memory cells (not shown) and a second bit signal PIN<2> of the input control signal PIN may be generated to have a logic "high" level to store the second row address R2 and the second column address C2. When the sampling command ESMP is generated a first time, the second bit signal ELS<2> of the error latch signal ELS may be generated to latch the error flag EFLAG with information on whether an error exists in the codeword CW that is stored in the second memory cells and to output the latched error flag EFLAG as the second bit signal LEF<2> of the latch error flag LEF. When the second bit signal ELS<2> of the error latch signal ELS is generated, the second bit signal LEF<2> of the latch error flag LEF may be generated to have a logic "high" level because the error flag EFLAG is generated to have a logic "high" level.

When the sampling command ESMP is generated a second time, a third row address R3 and a third column address C3 may be generated to access the third memory cells (not shown) and a third bit signal PIN<3> of the input control signal PIN may be generated to have a logic "high" level to store the third row address R3 and the third column address C3. When the sampling command ESMP is generated a second time, the third bit signal ELS<3> of the error latch signal ELS may be generated to latch the error flag EFLAG with information on whether an error exists in the codeword CW that is stored in the third memory cells and to output the latched error flag EFLAG as the third bit signal LEF<3> of the latch error flag LEF. When the third bit signal ELS<3> of the error latch signal ELS is generated, the third bit signal LEF<3> of the latch error flag LEF is not generated because the error flag EFLAG is not generated.

When the sampling command ESMP is generated a third time, a fourth row address R4 and a fourth column address C4 may be generated to access the fourth memory cells (not shown) and a fourth bit signal PIN<4> of the input control signal PIN may be generated to have a logic "high" level to store the fourth row address R4 and the fourth column address C4. When the sampling command ESMP is generated a third time, the fourth bit signal ELS<4> of the error latch signal ELS may be generated to latch the error flag EFLAG with information on whether an error exists in the codeword CW that is stored in the fourth memory cells and to output the latched error flag EFLAG as the fourth bit signal LEF<4> of the latch error flag LEF. When the fourth bit signal ELS<4> of the error latch signal ELS is generated, the fourth bit signal LEF<4> of the latch error flag LEF is not generated because the error flag EFLAG is not generated.

Figure 27:
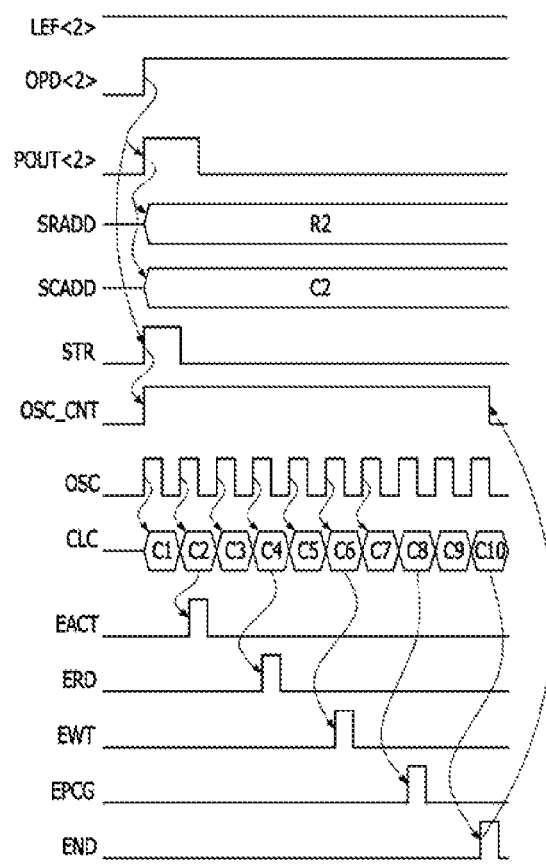

FIG. 27 is a timing diagram, illustrating the ECS operation that is performed for the second memory cells while the second bit signal LEF<2> of the latch error flag LEF is generated to have a logic "high" level based on an error of the codeword CW that is stored in the second memory cells of the first to fourth memory cells during the sampling period. The ECS operation that is performed for the second memory cells during the operation period will be described in detail hereinafter.

If the second bit signal OPD<2> of the operation period signal OPD is generated to have a logic "high" level so that the second memory cells are put in the operation period, the second bit signal POUT<2> of the output control signal POUT may be generated to have a logic "high" level so that the second row address R2 and the second column address C2 that are stored based on the second bit signal PIN<2> of the input control signal PIN are outputted as the selection row address SRADD and the selection column address SCADD.

If the oscillation control signal OSC_CNT is generated to have a logic "high" level based on the start signal STR, which is generated to have a logic "high" level by the second bit signal OPD<2> of the operation period signal OPD, the periodic signal OSC may be generated to be toggled. The logic level combination of the clock code CLC may change whenever a pulse of the periodic signal OSC occurs so that the clock code CLC is generated to sequentially have first to tenth logic level combinations C1~C10. When the clock code CLC has the second logic level combination C2, the ECS active command EACT may be generated. The ECS operation for the second memory cells may be performed based on the ECS active command EACT. When the clock code CLC has the fourth logic level combination C4, the ECS read command ERD may be generated. The ECS read operation for the second memory cells may be performed based on the ECS read command ERD. When the clock code CLC has the sixth logic level combination C6, the ECS write command EWT may be generated. The ECS write operation for the second memory cells may be performed based on the ECS write command EWT. When the clock code CLC has the eighth logic level combination C8, the ECS pre-charge command EPCG may be generated. The pre-charge operation for the second memory cells may be performed based on the ECS pre-charge command EPCG. If the end signal END is generated when the clock code CLC has the tenth logic level combination C10, a logic level of the oscillation control signal OSC_CNT may change from a logic "high" level into a logic "low" level to terminate generation of the periodic signal OSC.

As described above, the semiconductor device 2010 may operate such that the ECS operation is selectively performed for only memory cells storing the codewords with errors. Thus, it may be possible to reduce power consumption of the semiconductor device 2010.

Figure 28:
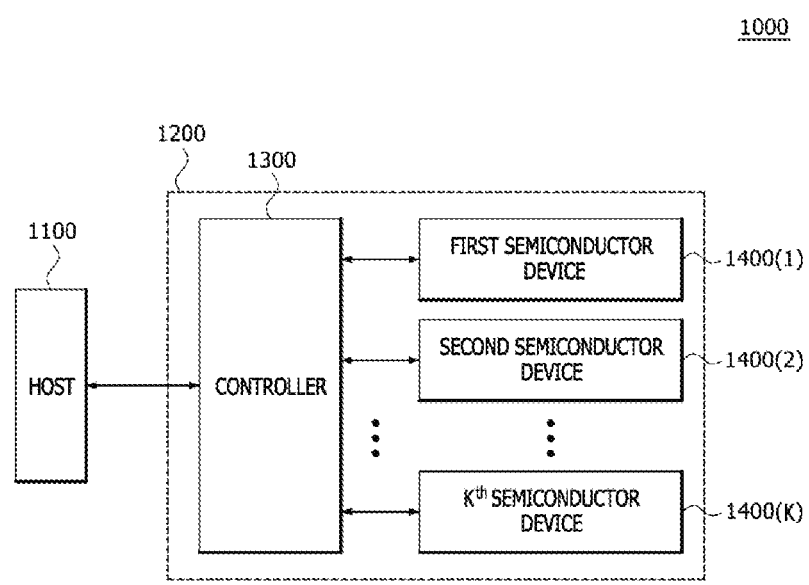
FIG. 28 is a block diagram, illustrating a configuration of an electronic system, according to an embodiment of the present disclosure.

FIG. 28 is a block diagram illustrating a configuration of an electronic system 1000 according to an embodiment of the present disclosure. As illustrated in FIG. 28, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform a refresh operation, a read operation, a write operation, or an ECS operation. Each of the semiconductor devices 1400(K:1) may perform the ECS operation based on a refresh command to correct an error of a codeword stored in memory cells included in the semiconductor device and to restore the corrected codeword into the memory cells. Each of the semiconductor devices 1400(K:1) may store information on the number of errors detected by the ECS operations for all of the memory cells, information on the maximum number of errors of a row path, and information on a row path having the maximum number of errors. Each of the semiconductor devices 1400(K:1) may perform the repair operation based on the information stored during the ECS operation. The controller 1300 may receive the information stored during the ECS operation from the semiconductor devices 1400(K:1) to restrict the internal operations for the memory cells connected to a row path having the maximum number of errors.

The controller 1300 may include the controller 10 illustrated in FIGS. 1 and 14. Each of the semiconductor devices 1400(K:1) may include the semiconductor device 20a illustrated in FIG. 2, the semiconductor device 20b illustrated in FIG. 15, or the semiconductor device 2010 illustrated in FIG. 16. In some embodiments, the semiconductor device 20a, the semiconductor device 20b, or the semiconductor device 2010 may include any one of a dynamic random access memory (DRAM), a phase change random access memory (PRAM), a resistive random access memory (RRAM), a magnetic random access memory (MRAM), and a ferroelectric random access memory (FRAM).

What is claimed is:
1. A semiconductor device comprising:
an error check and scrub (ECS) command generation circuit configured to generate an ECS command based on a refresh command;
a period signal generation circuit configured to generate a sampling period signal, during a sampling period, based on the ECS command and configured to generate an operation period signal, during an operation period, based on the ECS command; and
an ECS control circuit configured to generate an ECS active command during the sampling period,
wherein the ECS active command is generated to perform an ECS active operation to load a codeword, stored in at least one memory cell, connected to a row path that is selected by a row address, on at least one bit line to sense and amplify the codeword,
wherein a latch error flag is generated to include information on whether errors exist in codewords during the sampling period, and
wherein an ECS operation is performed based on the latch error flag, during the operation period, for memory cells that store an erroneous codeword among the codewords.

2. The semiconductor device of claim 1, wherein the ECS command generation circuit generates the ECS command when the refresh command is generated a certain number of times, corresponding to a predetermined set value.

3. The semiconductor device of claim 1,
wherein the codewords include a first codeword and a second codeword, and
wherein a first latch error flag, including information on whether an error exists in the first codeword, and a second latch error flag, including information on whether an error exists in the second codeword, are generated during the sampling period.

4. The semiconductor device of claim 3,
wherein the operation period signal includes a first operation period signal and a second operation period signal, and the memory cells include first memory cells and second memory cells,
wherein the ECS operation for the first memory cells, storing the first codeword, is performed based on the first latch error flag during a first operation period in which the first operation period signal is generated, and
wherein the ECS operation for the second memory cells, storing the second codeword, is performed based on the second latch error flag during a second operation period in which the second operation period signal is generated.

5. The semiconductor device of claim 1, wherein the ECS control circuit configured to generate an ECS read command, an ECS write command, an ECS pre-charge command, a sampling command, and an end signal based on the sampling period signal, the operation period signal, and the latch error flag.

6. The semiconductor device of claim 5, wherein the ECS control circuit generates the ECS read command and the sampling command for each of the codewords, and the end signal during the sampling period.

7. The semiconductor device of claim 5, wherein the ECS control circuit sequentially generates the ECS active command, the ECS read command, the ECS write command, the ECS pre-charge command, and the end signal for storing the erroneous codeword when the latch error flag is generated during the operation period.

8. The semiconductor device of claim 5, wherein the ECS control circuit includes:
a start signal generation circuit configured to generate a start signal based on the sampling period signal, the operation period signal, and the latch error flag;
a clock code generation circuit configured to generate a clock code based on the start signal and the end signal;
a sampling decoder configured to generate the ECS active command, the ECS read command, and the sampling command based on the sampling period signal and the clock code; and
an operation decoder configured to generate the ECS active command, the ECS read command, the ECS write command, the ECS pre-charge command, and the end signal based on the operation period signal, the latch error flag, and the clock code.

9. The semiconductor device of claim 8, wherein the clock code generation circuit includes:
an oscillation control signal generation circuit configured to generate an oscillation control signal based on the start signal and the end signal;
a periodic signal generation circuit configured to generate a periodic signal based on the oscillation control signal; and
a clock counter configured to count the periodic signal to adjust a logic level combination of the clock code.

10. The semiconductor device of claim 5, further comprising a selection address generation circuit configured to generate a selection row address and a selection column address for accessing the memory cells based on the ECS active command and the sampling command during the sampling period and configured to generate the selection row address and the selection column address based on the operation period signal during the operation period.

11. The semiconductor device of claim 10, wherein the selection address generation circuit includes:
an address counter configured to count the sampling command to generate a row address and a column address;
an address pipe configured to store the row address and the column address therein based on an input control signal that is generated based on the sampling command and the ECS active command and configured to output the stored row address and the stored column address as a pipe row address and a pipe column address based on an output control signal that is generated based on the operation period signal; and
an address selection circuit configured to generate the selection row address and the selection column address from the row address, the column address, the pipe row address, and the pipe column address based on the sampling period signal and the operation period signal.

12. The semiconductor device of claim 5, further comprising a latch error flag generation circuit configured to generate the latch error flag by latching the error flag based on the ECS active command and the sampling command.

13. The semiconductor device of claim 12, wherein the latch error flag generation circuit includes:
an error latch control circuit configured to generate an error latch signal based on the ECS active command and the sampling command; and
an error flag latch circuit configured to generate the latch error flag by latching the error flag based on the error latch signal.

14. A semiconductor device comprising:
a period signal generation circuit configured to generate a sampling period signal and an operation period signal based on an error check and scrub (ECS) command that is generated according to a refresh command; and
an ECS control circuit configured to operate so that a latch error flag, including information on whether errors exist in codewords, is generated based on the sampling period signal and configured to operate so that an ECS operation is performed based on the latch error flag and the operation period signal for memory cells that store an erroneous codeword among the codewords,
wherein the ECS control circuit generates an ECS active command during the sampling period,
wherein the ECS active command is generated to perform an ECS active operation to load a codeword, stored in at least one memory cell, connected to a row path that is selected by a row address, on at least one bit line to sense and amplify the codeword.

15. The semiconductor device of claim 14,
wherein the codewords include a first codeword and a second codeword, and
wherein a first latch error flag, including information on whether an error exists, in the first codeword and a second latch error flag, including information on whether an error exists, in the second codeword are generated during a sampling period in which the sampling period signal is generated.

16. The semiconductor device of claim 15,
wherein the operation period signal includes a first operation period signal and a second operation period signal, and the memory cells include first memory cells and second memory cells,
wherein the ECS operation for the first memory cells storing the first codeword is performed based on the first latch error flag during a first operation period in which the first operation period signal is generated, and
wherein the ECS operation for the second memory cells, storing the second codeword, is performed based on the second latch error flag during a second operation period in which the second operation period signal is generated.

17. The semiconductor device of claim 14, wherein the ECS control circuit generates an ECS read command and a sampling command for each of the codewords, and an end signal during a sampling period in which the sampling period signal is generated.

18. The semiconductor device of claim 17, further comprising a latch error flag generation circuit configured to generate the latch error flag by latching an error flag based on the ECS active command and the sampling command.

19. The semiconductor device of claim 14, wherein the ECS control circuit sequentially generates the ECS active command, an ECS read command, an ECS write command, an ECS pre-charge command, and an end signal storing the erroneous codeword when the latch error flag is generated during an operation period in which the operation period signal is generated.

20. The semiconductor device of claim 14, further comprising a selection address generation circuit configured to generate, during a sampling period, a selection row address and a selection column address to access the memory cells based on the ECS active command and a sampling command and configured to generate, during an operation period, the selection row address and the selection column address based on the operation period signal.

* * * * *